United States Patent
Kijima et al.

(10) Patent No.: US 9,577,654 B2
(45) Date of Patent: Feb. 21, 2017

(54) ANALOG-DIGITAL CONVERTER AND CONTROL METHOD

(71) Applicant: Cypress Semiconductor Corporation, San Jose, CA (US)

(72) Inventors: Masashi Kijima, Aichi (JP); Satoru Mizuta, Aichi (JP); Tsutomu Tanii, Aichi (JP); Hiroyuki Matsunami, Kasugai (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/977,598

(22) Filed: Dec. 21, 2015

(65) Prior Publication Data

US 2016/0373124 A1     Dec. 22, 2016

Related U.S. Application Data

(60) Provisional application No. 62/180,837, filed on Jun. 17, 2015.

(51) Int. Cl.
*H03M 1/38* (2006.01)
*H03M 1/00* (2006.01)
*H03M 1/46* (2006.01)

(52) U.S. Cl.
CPC ............. *H03M 1/002* (2013.01); *H03M 1/38* (2013.01); *H03M 1/462* (2013.01); *H03M 1/466* (2013.01)

(58) Field of Classification Search
CPC ...... H03M 1/002; H03M 1/466; H03M 1/462; H03M 1/38
(Continued)

(56) References Cited

U.S. PATENT DOCUMENTS 5,920,275 A    7/1999  Hester
6,906,657 B1   6/2005  Chandra
(Continued)

OTHER PUBLICATIONS

International Search Report for International Application No. PCT/US16/18625 dated Apr. 1, 2016; 7 pages.
(Continued)

*Primary Examiner* — Brian Young

(57) ABSTRACT

In an example embodiment, an analog-digital converter includes digital-analog converter, a comparator, and a register. The digital-analog converter is configured to output a differential voltage between a reference voltage and a voltage of an analog signal. The comparator is configured to output a comparison signal corresponding to the differential voltage output by the digital-analog converter. The register is configured to cause the digital-analog converter to generate N pairs of differential voltages (N≥1), to cause the digital-analog converter to generate an $(N+1)^{th}$ pair of differential voltages by causing one of a positive side and a negative side of the digital-analog converter to output an $(N+1)^{th}$ differential voltage and causing the other of the positive side and the negative side to output a differential voltage equal to the $N^{th}$ differential voltage as an $(N+1)^{th}$ differential voltage, and to output a digital signal corresponding to a comparison signal having a smallest voltage among (N+1) comparison signals.

20 Claims, 23 Drawing Sheets

(58) Field of Classification Search
USPC .................................................. 341/155, 161
See application file for complete search history.

(56) References Cited

U.S. PATENT DOCUMENTS

| | | | |
|---|---|---|---|
| 7,151,475 B2* | 12/2006 | Boemler | H03M 1/46 |
| | | | 341/118 |
| 7,209,069 B2 | 4/2007 | Felder | |
| 7,432,844 B2* | 10/2008 | Mueck | H03M 1/0682 |
| | | | 341/161 |
| 7,796,077 B2 | 9/2010 | Mitikiri | |
| 7,876,254 B2 | 1/2011 | Berens et al. | |
| 7,999,719 B2 | 8/2011 | Jeon et al. | |
| 8,102,292 B1 | 1/2012 | Ess | |
| 8,193,957 B2 | 6/2012 | Yoshioka | |
| 8,497,795 B2* | 7/2013 | Le Tual | H03M 1/468 |
| | | | 341/155 |
| 8,519,874 B2 | 8/2013 | Aruga et al. | |
| 8,638,248 B2* | 1/2014 | Wu | H03M 1/1047 |
| | | | 341/118 |
| 9,001,926 B2 | 4/2015 | Shad | |
| 9,013,442 B2* | 4/2015 | Hotelling | G06F 3/0416 |
| | | | 178/18.06 |
| 9,432,044 B1* | 8/2016 | Lee | H03M 1/1061 |
| 9,455,737 B1* | 9/2016 | Rajaee | H03M 3/464 |
| 9,473,162 B2* | 10/2016 | Girardi | H03M 1/46 |

OTHER PUBLICATIONS

Written Opinion of the International Searching Authority for International Application No. PCT/US16/18625 mailed Apr. 1, 2016; 3 pages.

Maxim Integrated Products, Inc., "Understanding SAR ADCs: Their Architecture and Comparison with Other ADCs," Oct. 2, 2001; 6 pages.

* cited by examiner

FIG. 11

| | $S_A$ | IN1 | IN0 | $S_{H1}$ | $S_{H0}$ | $S_{L1}$ | $S_{L0}$ |
|---|---|---|---|---|---|---|---|
| Sampling stage | 1 | * | * | 0 | 0 | 0 | 0 |
| Trial stage | 0 | 0 | 0 | 0 | 0 | $\overline{S_{H1}}$ | $\overline{S_{H0}}$ |
| | 0 | 0 | 1 | 0 | 1 | | |
| | 0 | 1 | 0 | 1 | 0 | | |
| | 0 | 1 | 1 | 1 | 1 | | |

FIG. 12

| VIP | First bit trial | | | | | Second bit trial | | | | | Digital output | | |
|---|---|---|---|---|---|---|---|---|---|---|---|---|---|
| | IN1 | IN0 | VOP | VOM | CMP | IN1 | IN0 | VOP | VOM | CMP | D1 | D0 | Dout |
| 1 | 1 | 0 | 7 | 4 | 0 | 0 | 1 | 6 | 5 | 0 | 0 | 0 | 0 |
| 3 | 1 | 0 | 5 | 4 | 0 | 0 | 1 | 4 | 5 | 1 | 0 | 1 | 1 |
| 5 | 1 | 0 | 3 | 4 | 1 | 1 | 1 | 4 | 3 | 0 | 1 | 0 | 2 |
| 7 | 1 | 0 | 1 | 4 | 1 | 1 | 1 | 2 | 3 | 1 | 1 | 1 | 3 |

FIG. 15

| | $S_A$ | IN1 | IN0 | CTL | $S_{HP1}$ | $S_{HP0}$ | $S_{HPC}$ | $S_{LP1}$ | $S_{LP0}$ | $S_{LPC}$ | $S_{HM1}$ | $S_{HM0}$ | $S_{LM1}$ | $S_{LM0}$ |
|---|---|---|---|---|---|---|---|---|---|---|---|---|---|---|
| Sampling stage | 1 | * | * | * | 0 | 0 | 0 | 0 | 0 | 0 | 0 | 0 | 0 | 0 |
| Trial stage | 0 | 0 | 0 | 0 | 0 | 0 | 0 | $S_{HP1}$ | $S_{HP0}$ | $S_{HPC}$ | 0 | 0 | $S_{HM1}$ | $S_{HM0}$ |
| | 0 | 0 | 0 | 1 | 0 | 1 | 0 | | | | 0 | 0 | | |
| | 0 | 0 | 1 | 0 | 0 | 1 | 0 | | | | 0 | 1 | | |
| | 0 | 0 | 1 | 1 | 1 | 0 | 0 | | | | 0 | 1 | | |
| | 0 | 1 | 0 | 0 | 1 | 0 | 0 | | | | 1 | 0 | | |
| | 0 | 1 | 0 | 1 | 1 | 1 | 0 | | | | 1 | 0 | | |
| | 0 | 1 | 1 | 0 | 1 | 1 | 0 | | | | 1 | 1 | | |
| | 0 | 1 | 1 | 1 | 1 | 1 | 1 | | | | 1 | 1 | | |

FIG. 16

| VIP | First bit trial | | | | | | Second bit trial | | | | | | Last bit trial | | | | | | Digital output | | | |
|---|---|---|---|---|---|---|---|---|---|---|---|---|---|---|---|---|---|---|---|---|---|---|
| | IN1 | IN0 | CTL | VOP | VOM | CMP | IN1 | IN0 | CTL | VOP | VOM | CMP | IN1 | IN0 | CTL | VOP | VOM | CMP | D2 | D1 | D0 | Dout |
| 0.5 | 1 | 0 | 0 | 7.5 | 4 | 0 | 0 | 1 | 0 | 6.5 | 5 | 0 | 0 | 0 | 1 | 6.5 | 6 | 0 | 0 | 0 | 0 | 0 |
| 1.5 | 1 | 0 | 0 | 6.5 | 4 | 0 | 0 | 1 | 0 | 5.5 | 5 | 0 | 0 | 0 | 1 | 5.5 | 6 | 1 | 0 | 0 | 1 | 1 |
| 2.5 | 1 | 0 | 0 | 5.5 | 4 | 0 | 0 | 1 | 0 | 4.5 | 5 | 1 | 0 | 1 | 1 | 5.5 | 5 | 0 | 0 | 1 | 0 | 2 |
| 3.5 | 1 | 0 | 0 | 4.5 | 4 | 0 | 0 | 1 | 0 | 3.5 | 5 | 1 | 0 | 1 | 1 | 4.5 | 5 | 1 | 0 | 1 | 1 | 3 |
| 4.5 | 1 | 0 | 0 | 3.5 | 4 | 1 | 1 | 1 | 0 | 4.5 | 3 | 0 | 1 | 0 | 1 | 4.5 | 4 | 0 | 1 | 0 | 0 | 4 |
| 5.5 | 1 | 0 | 0 | 2.5 | 4 | 1 | 1 | 1 | 0 | 3.5 | 3 | 0 | 1 | 0 | 1 | 3.5 | 4 | 1 | 1 | 0 | 1 | 5 |
| 6.5 | 1 | 0 | 0 | 1.5 | 4 | 1 | 1 | 1 | 0 | 2.5 | 3 | 1 | 1 | 1 | 1 | 3.5 | 3 | 0 | 1 | 1 | 0 | 6 |
| 7.5 | 1 | 0 | 0 | 0.5 | 4 | 1 | 1 | 1 | 0 | 1.5 | 3 | 1 | 1 | 1 | 1 | 2.5 | 3 | 1 | 1 | 1 | 1 | 7 |

FIG. 21

|  | $S_A$ | IN2 | $S_H$ | $S_L$ |
|---|---|---|---|---|
| Sampling stage | 1 | 0 | 0 | 0 |
|  | 1 | 1 | 0 | 0 |
| Trial stage | 0 | 0 | 0 | 1 |
|  | 0 | 1 | 1 | 0 |

FIG. 22

| Decoder input | | | Decoder output | | | | | | | | | Output | | |
|---|---|---|---|---|---|---|---|---|---|---|---|---|---|---|
| IN1 | IN0 | CTL | $S_{RP4}$ | $S_{RP3}$ | $S_{RP2}$ | $S_{RP1}$ | $S_{RP0}$ | $S_{RM3}$ | $S_{RM2}$ | $S_{RM1}$ | $S_{RM0}$ | VRP | VRM | Δ |
| 0 | 0 | 0 | 0 | 0 | 0 | 0 | 1 | 0 | 0 | 0 | 1 | 0 | 16 | -16 |
| 0 | 0 | 1 | 0 | 0 | 0 | 1 | 0 | 0 | 0 | 0 | 1 | 4 | 16 | -12 |
| 0 | 1 | 0 | 0 | 0 | 0 | 1 | 0 | 0 | 0 | 1 | 0 | 4 | 12 | -8 |
| 0 | 1 | 1 | 0 | 0 | 1 | 0 | 0 | 0 | 0 | 1 | 0 | 8 | 12 | -4 |
| 1 | 0 | 0 | 0 | 0 | 1 | 0 | 0 | 0 | 1 | 0 | 0 | 8 | 8 | 0 |
| 1 | 0 | 1 | 0 | 1 | 0 | 0 | 0 | 0 | 1 | 0 | 0 | 12 | 8 | 4 |
| 1 | 1 | 0 | 0 | 1 | 0 | 0 | 0 | 1 | 0 | 0 | 0 | 12 | 4 | 8 |
| 1 | 1 | 1 | 1 | 0 | 0 | 0 | 0 | 1 | 0 | 0 | 0 | 16 | 4 | 12 |

FIG. 23

| VIP | First bit trial | | | | | | | | | Second bit trial | | | | | | | | | Third bit trial | | | | | | | | | Last bit trial | | | | | | | | | Digital output | | | | |
|---|---|---|---|---|---|---|---|---|---|---|---|---|---|---|---|---|---|---|---|---|---|---|---|---|---|---|---|---|---|---|---|---|---|---|---|---|---|---|---|---|
| | IN2 | IN1 | IN0 | CTL | VRP | VRM | VOP | VOM | CMP | IN2 | IN1 | IN0 | CTL | VRP | VRM | VOP | VOM | CMP | IN2 | IN1 | IN0 | CTL | VRP | VRM | VOP | VOM | CMP | IN2 | IN1 | IN0 | CTL | VRP | VRM | VOP | VOM | CMP | D3 | D2 | D1 | D0 | Dout |
| 0.5 | 1 | 0 | 0 | 0 | 0 | 16 | 15.5 | 8.0 | 0 | 0 | 1 | 1 | 0 | 8 | 8 | 13.5 | 10.0 | 0 | 0 | 0 | 1 | 0 | 4 | 12 | 12.5 | 11.0 | 0 | 0 | 0 | 0 | 1 | 4 | 16 | 12.5 | 12.0 | 0 | 0 | 0 | 0 | 0 | 0 |
| 1.5 | 1 | 0 | 0 | 0 | 0 | 16 | 14.5 | 8.0 | 0 | 0 | 1 | 1 | 0 | 8 | 8 | 12.5 | 10.0 | 0 | 0 | 0 | 1 | 0 | 4 | 12 | 11.5 | 11.0 | 1 | 0 | 0 | 1 | 1 | 4 | 16 | 11.5 | 12.0 | 1 | 0 | 0 | 0 | 1 | 1 |
| 2.5 | 1 | 0 | 0 | 0 | 0 | 16 | 13.5 | 8.0 | 0 | 0 | 1 | 1 | 0 | 8 | 8 | 11.5 | 10.0 | 0 | 0 | 0 | 1 | 0 | 4 | 12 | 10.5 | 11.0 | 0 | 0 | 1 | 1 | 1 | 8 | 12 | 11.5 | 11.0 | 0 | 0 | 0 | 1 | 0 | 2 |
| 3.5 | 1 | 0 | 0 | 0 | 0 | 16 | 12.5 | 8.0 | 0 | 0 | 1 | 1 | 0 | 8 | 8 | 10.5 | 10.0 | 0 | 0 | 0 | 1 | 0 | 4 | 12 | 9.5 | 11.0 | 1 | 0 | 1 | 1 | 1 | 8 | 12 | 10.5 | 11.0 | 1 | 0 | 0 | 1 | 1 | 3 |
| 4.5 | 1 | 0 | 0 | 0 | 0 | 16 | 11.5 | 8.0 | 0 | 0 | 1 | 1 | 0 | 8 | 8 | 9.5 | 10.0 | 1 | 0 | 1 | 1 | 0 | 12 | 4 | 10.5 | 9.0 | 0 | 1 | 0 | 0 | 1 | 8 | 8 | 10.5 | 10.0 | 0 | 0 | 1 | 0 | 0 | 4 |
| 5.5 | 1 | 0 | 0 | 0 | 0 | 16 | 10.5 | 8.0 | 0 | 0 | 1 | 1 | 0 | 8 | 8 | 8.5 | 10.0 | 1 | 0 | 1 | 1 | 0 | 12 | 4 | 9.5 | 9.0 | 1 | 1 | 0 | 1 | 1 | 8 | 8 | 9.5 | 10.0 | 1 | 0 | 1 | 0 | 1 | 5 |
| 6.5 | 1 | 0 | 0 | 0 | 0 | 16 | 9.5 | 8.0 | 0 | 0 | 1 | 1 | 0 | 8 | 8 | 7.5 | 10.0 | 1 | 0 | 1 | 1 | 0 | 12 | 4 | 8.5 | 9.0 | 0 | 1 | 1 | 1 | 1 | 12 | 4 | 9.5 | 9.0 | 0 | 0 | 1 | 1 | 0 | 6 |
| 7.5 | 1 | 0 | 0 | 0 | 0 | 16 | 8.5 | 8.0 | 0 | 0 | 1 | 1 | 0 | 8 | 8 | 6.5 | 10.0 | 1 | 0 | 1 | 1 | 0 | 12 | 4 | 7.5 | 9.0 | 1 | 1 | 1 | 1 | 1 | 12 | 4 | 8.5 | 9.0 | 1 | 0 | 1 | 1 | 1 | 7 |
| 8.5 | 1 | 0 | 0 | 0 | 0 | 16 | 7.5 | 8.0 | 1 | 1 | 1 | 0 | 0 | 8 | 8 | 9.5 | 6.0 | 0 | 1 | 0 | 1 | 0 | 4 | 12 | 8.5 | 7.0 | 0 | 0 | 0 | 0 | 1 | 4 | 16 | 8.5 | 8.0 | 0 | 1 | 0 | 0 | 0 | 8 |
| 9.5 | 1 | 0 | 0 | 0 | 0 | 16 | 6.5 | 8.0 | 1 | 1 | 1 | 0 | 0 | 8 | 8 | 8.5 | 6.0 | 0 | 1 | 0 | 1 | 0 | 4 | 12 | 7.5 | 7.0 | 1 | 0 | 0 | 1 | 1 | 4 | 16 | 7.5 | 8.0 | 1 | 1 | 0 | 0 | 1 | 9 |
| 10.5 | 1 | 0 | 0 | 0 | 0 | 16 | 5.5 | 8.0 | 1 | 1 | 1 | 0 | 0 | 8 | 8 | 7.5 | 6.0 | 0 | 1 | 0 | 1 | 0 | 4 | 12 | 6.5 | 7.0 | 0 | 0 | 1 | 1 | 1 | 8 | 12 | 7.5 | 7.0 | 0 | 1 | 0 | 1 | 0 | 10 |
| 11.5 | 1 | 0 | 0 | 0 | 0 | 16 | 4.5 | 8.0 | 1 | 1 | 1 | 0 | 0 | 8 | 8 | 6.5 | 6.0 | 0 | 1 | 0 | 1 | 0 | 4 | 12 | 5.5 | 7.0 | 1 | 0 | 1 | 1 | 1 | 8 | 12 | 6.5 | 7.0 | 1 | 1 | 0 | 1 | 1 | 11 |
| 12.5 | 1 | 0 | 0 | 0 | 0 | 16 | 3.5 | 8.0 | 1 | 1 | 1 | 0 | 0 | 8 | 8 | 5.5 | 6.0 | 0 | 1 | 1 | 1 | 0 | 12 | 4 | 6.5 | 5.0 | 0 | 1 | 0 | 0 | 1 | 12 | 8 | 6.5 | 6.0 | 0 | 1 | 1 | 0 | 0 | 12 |
| 13.5 | 1 | 0 | 0 | 0 | 0 | 16 | 2.5 | 8.0 | 1 | 1 | 1 | 0 | 0 | 8 | 8 | 4.5 | 6.0 | 1 | 1 | 1 | 1 | 0 | 12 | 4 | 5.5 | 5.0 | 1 | 1 | 0 | 1 | 1 | 12 | 8 | 5.5 | 6.0 | 1 | 1 | 1 | 0 | 1 | 13 |
| 14.5 | 1 | 0 | 0 | 0 | 0 | 16 | 1.5 | 8.0 | 1 | 1 | 1 | 0 | 0 | 8 | 8 | 3.5 | 6.0 | 1 | 1 | 1 | 1 | 0 | 12 | 4 | 4.5 | 5.0 | 0 | 1 | 1 | 1 | 1 | 16 | 4 | 5.5 | 5.0 | 0 | 1 | 1 | 1 | 0 | 14 |
| 15.5 | 1 | 0 | 0 | 0 | 0 | 16 | 0.5 | 8.0 | 1 | 1 | 1 | 0 | 0 | 8 | 8 | 2.5 | 6.0 | 1 | 1 | 1 | 1 | 0 | 12 | 4 | 3.5 | 5.0 | 1 | 1 | 1 | 1 | 1 | 16 | 4 | 4.5 | 5.0 | 1 | 1 | 1 | 1 | 1 | 15 |

FIG. 24

| ΔVi | First bit trial | | | | | | | | | Second bit trial | | | | | | | | | Third bit trial | | | | | | | | | Last bit trial | | | | | | | | | Digital output | | | | |
|---|---|---|---|---|---|---|---|---|---|---|---|---|---|---|---|---|---|---|---|---|---|---|---|---|---|---|---|---|---|---|---|---|---|---|---|---|---|---|---|---|
| | IN2 | IN1 | IN0 | CTL | VRP | VRM | VOP | VOM | CMP | IN2 | IN1 | IN0 | CTL | VRP | VRM | VOP | VOM | CMP | IN2 | IN1 | IN0 | CTL | VRP | VRM | VOP | VOM | CMP | IN2 | IN1 | IN0 | CTL | VRP | VRM | VOP | VOM | CMP | D3 | D2 | D1 | D0 | Dout |
| -7.5 | 1 | 0 | 0 | 0 | 0 | 16 | 11.5 | 4.0 | 0 | 0 | 1 | 0 | 0 | 8 | 8 | 9.5 | 6.0 | 0 | 0 | 1 | 1 | 0 | 4 | 12 | 8.5 | 7.0 | 0 | 0 | 0 | 0 | 1 | 4 | 16 | 8.5 | 8.0 | 0 | 0 | 0 | 0 | 0 | 0 |
| -6.5 | 1 | 0 | 0 | 0 | 0 | 16 | 11.0 | 4.5 | 0 | 0 | 1 | 0 | 0 | 8 | 8 | 9.0 | 6.5 | 0 | 0 | 1 | 1 | 0 | 4 | 12 | 8.0 | 7.5 | 0 | 0 | 0 | 1 | 1 | 4 | 16 | 8.0 | 8.5 | 1 | 0 | 0 | 0 | 1 | 1 |
| -5.5 | 1 | 0 | 0 | 0 | 0 | 16 | 10.5 | 5.0 | 0 | 0 | 1 | 0 | 0 | 8 | 8 | 8.5 | 7.0 | 0 | 0 | 1 | 1 | 0 | 4 | 12 | 7.5 | 8.0 | 1 | 0 | 1 | 1 | 1 | 8 | 12 | 8.5 | 8.0 | 0 | 0 | 0 | 1 | 0 | 2 |
| -4.5 | 1 | 0 | 0 | 0 | 0 | 16 | 10.0 | 5.5 | 0 | 0 | 1 | 0 | 0 | 8 | 8 | 8.0 | 7.5 | 0 | 0 | 1 | 1 | 0 | 4 | 12 | 7.0 | 8.5 | 1 | 0 | 1 | 1 | 1 | 8 | 12 | 8.0 | 8.5 | 1 | 0 | 0 | 1 | 1 | 3 |
| -3.5 | 1 | 0 | 0 | 0 | 0 | 16 | 9.5 | 6.0 | 0 | 0 | 1 | 0 | 0 | 8 | 8 | 7.5 | 8.0 | 1 | 0 | 1 | 1 | 0 | 12 | 4 | 8.5 | 7.0 | 0 | 1 | 1 | 0 | 1 | 8 | 8 | 8.5 | 8.0 | 0 | 0 | 1 | 0 | 0 | 4 |
| -2.5 | 1 | 0 | 0 | 0 | 0 | 16 | 9.0 | 6.5 | 0 | 0 | 1 | 0 | 0 | 8 | 8 | 7.0 | 8.5 | 1 | 0 | 1 | 1 | 0 | 12 | 4 | 8.0 | 7.5 | 0 | 1 | 1 | 0 | 1 | 8 | 8 | 8.0 | 8.5 | 1 | 0 | 1 | 0 | 1 | 5 |
| -1.5 | 1 | 0 | 0 | 0 | 0 | 16 | 8.5 | 7.0 | 0 | 0 | 1 | 0 | 0 | 8 | 8 | 6.5 | 9.0 | 1 | 0 | 1 | 1 | 0 | 12 | 4 | 7.5 | 8.0 | 1 | 1 | 1 | 1 | 1 | 16 | 4 | 8.5 | 8.0 | 0 | 0 | 1 | 1 | 0 | 6 |
| -0.5 | 1 | 0 | 0 | 0 | 0 | 16 | 8.0 | 7.5 | 0 | 0 | 1 | 0 | 0 | 8 | 8 | 6.0 | 9.5 | 1 | 0 | 1 | 1 | 0 | 12 | 4 | 7.0 | 8.5 | 1 | 1 | 1 | 1 | 1 | 16 | 4 | 8.0 | 8.5 | 1 | 0 | 1 | 1 | 1 | 7 |
| 0.5 | 1 | 0 | 0 | 0 | 0 | 16 | 7.5 | 8.0 | 1 | 1 | 1 | 0 | 0 | 8 | 8 | 9.5 | 6.0 | 0 | 1 | 1 | 1 | 0 | 4 | 12 | 8.5 | 7.0 | 0 | 1 | 0 | 0 | 1 | 4 | 16 | 8.5 | 8.0 | 0 | 1 | 0 | 0 | 0 | 8 |
| 1.5 | 1 | 0 | 0 | 0 | 0 | 16 | 7.0 | 8.5 | 1 | 1 | 1 | 0 | 0 | 8 | 8 | 9.0 | 6.5 | 0 | 1 | 1 | 1 | 0 | 4 | 12 | 8.0 | 7.5 | 0 | 1 | 0 | 1 | 1 | 4 | 16 | 8.0 | 8.5 | 1 | 1 | 0 | 0 | 1 | 9 |
| 2.5 | 1 | 0 | 0 | 0 | 0 | 16 | 6.5 | 9.0 | 1 | 1 | 1 | 0 | 0 | 8 | 8 | 8.5 | 7.0 | 0 | 1 | 1 | 1 | 0 | 4 | 12 | 7.5 | 8.0 | 1 | 1 | 1 | 1 | 1 | 8 | 12 | 8.5 | 8.0 | 0 | 1 | 0 | 1 | 0 | 10 |
| 3.5 | 1 | 0 | 0 | 0 | 0 | 16 | 6.0 | 9.5 | 1 | 1 | 1 | 0 | 0 | 8 | 8 | 8.0 | 7.5 | 0 | 1 | 1 | 1 | 0 | 4 | 12 | 7.0 | 8.5 | 1 | 1 | 1 | 1 | 1 | 8 | 12 | 8.0 | 8.5 | 1 | 1 | 0 | 1 | 1 | 11 |
| 4.5 | 1 | 0 | 0 | 0 | 0 | 16 | 5.5 | 10.0 | 1 | 1 | 1 | 0 | 0 | 8 | 8 | 7.5 | 8.0 | 1 | 1 | 1 | 1 | 0 | 12 | 4 | 8.5 | 7.0 | 0 | 1 | 1 | 0 | 1 | 8 | 8 | 8.5 | 8.0 | 0 | 1 | 1 | 0 | 0 | 12 |
| 5.5 | 1 | 0 | 0 | 0 | 0 | 16 | 5.0 | 10.5 | 1 | 1 | 1 | 0 | 0 | 8 | 8 | 7.0 | 8.5 | 1 | 1 | 1 | 1 | 0 | 12 | 4 | 8.0 | 7.5 | 0 | 1 | 1 | 0 | 1 | 8 | 8 | 8.0 | 8.5 | 1 | 1 | 1 | 0 | 1 | 13 |
| 6.5 | 1 | 0 | 0 | 0 | 0 | 16 | 4.5 | 11.0 | 1 | 1 | 1 | 0 | 0 | 8 | 8 | 6.5 | 9.0 | 1 | 1 | 1 | 1 | 0 | 12 | 4 | 7.5 | 8.0 | 1 | 1 | 1 | 1 | 1 | 16 | 4 | 8.5 | 8.0 | 0 | 1 | 1 | 1 | 0 | 14 |
| 7.5 | 1 | 0 | 0 | 0 | 0 | 16 | 4.0 | 11.5 | 1 | 1 | 1 | 0 | 0 | 8 | 8 | 6.0 | 9.5 | 1 | 1 | 1 | 1 | 0 | 12 | 4 | 7.0 | 8.5 | 1 | 1 | 1 | 1 | 1 | 16 | 4 | 8.0 | 8.5 | 1 | 1 | 1 | 1 | 1 | 15 |

FIG. 26

| Sampling | | | Coarse ADC processing | | | | Fine ADC processing | | | |
|---|---|---|---|---|---|---|---|---|---|---|
| $S_A$ | $S_R$ | $S_{R1}$ | $S_{R2}$ | $S_A$ | $S_R$ | $S_{R1}$ | $S_{R2}$ | $S_A$ | $S_R$ | $S_{R1}$ | $S_{R2}$ |
| 1 | 0 | 0 | 0 | 0 | 1 | 1 | 0 | 0 | 1 | 0 | 1 |

FIG. 27

| Analog input | | CMP# | Coarse 2-bit ADC processing | | | | | | Fine 1-bit ADC processing | | | | | Output |
|---|---|---|---|---|---|---|---|---|---|---|---|---|---|---|
| VIP | VIM | | VRP | VRM1 | ΔVIN | ΔVREF | CMPO | Dout_1 | VRP | VRM2 | ΔVREF | CMPO | Dout_2 | Dout |
| 7.5 | 0.5 | 4 | 6 | 2 | 7 | 4 | 1 | 3 | 6 | 0 | 6 | 1 | 3 | 3.5 |
| | | 3 | 4 | 4 | | 0 | 1 | | 4 | 2 | 2 | 1 | | |
| | | 2 | 2 | 6 | | -4 | 1 | | 2 | 4 | -2 | 1 | | |
| | | 1 | 0 | 8 | | -8 | 1 | | 0 | 6 | -6 | 1 | | |
| 6.5 | 1.5 | 4 | 6 | 2 | 5 | 4 | 1 | 3 | 6 | 0 | 6 | 0 | 2 | 3 |
| | | 3 | 4 | 4 | | 0 | 1 | | 4 | 2 | 2 | 1 | | |
| | | 2 | 2 | 6 | | -4 | 1 | | 2 | 4 | -2 | 1 | | |
| | | 1 | 0 | 8 | | -8 | 1 | | 0 | 6 | -6 | 1 | | |
| 5.5 | 2.5 | 4 | 6 | 2 | 3 | 4 | 0 | 2 | 6 | 0 | 6 | 0 | 2 | 2.5 |
| | | 3 | 4 | 4 | | 0 | 1 | | 4 | 2 | 2 | 1 | | |
| | | 2 | 2 | 6 | | -4 | 1 | | 2 | 4 | -2 | 1 | | |
| | | 1 | 0 | 8 | | -8 | 1 | | 0 | 6 | -6 | 1 | | |
| 4.5 | 3.5 | 4 | 6 | 2 | 1 | 4 | 0 | 2 | 6 | 0 | 6 | 0 | 1 | 2 |
| | | 3 | 4 | 4 | | 0 | 1 | | 4 | 2 | 2 | 0 | | |
| | | 2 | 2 | 6 | | -4 | 1 | | 2 | 4 | -2 | 1 | | |
| | | 1 | 0 | 8 | | -8 | 1 | | 0 | 6 | -6 | 1 | | |
| 3.5 | 4.5 | 4 | 6 | 2 | -1 | 4 | 0 | 1 | 6 | 0 | 6 | 0 | 1 | 1.5 |
| | | 3 | 4 | 4 | | 0 | 0 | | 4 | 2 | 2 | 0 | | |
| | | 2 | 2 | 6 | | -4 | 1 | | 2 | 4 | -2 | 1 | | |
| | | 1 | 0 | 8 | | -8 | 1 | | 0 | 6 | -6 | 1 | | |
| 2.5 | 5.5 | 4 | 6 | 2 | -3 | 4 | 0 | 1 | 6 | 0 | 6 | 0 | 0 | 1 |
| | | 3 | 4 | 4 | | 0 | 0 | | 4 | 2 | 2 | 0 | | |
| | | 2 | 2 | 6 | | -4 | 1 | | 2 | 4 | -2 | 0 | | |
| | | 1 | 0 | 8 | | -8 | 1 | | 0 | 6 | -6 | 1 | | |
| 1.5 | 6.5 | 4 | 6 | 2 | -5 | 4 | 0 | 0 | 6 | 0 | 6 | 0 | 0 | 0.5 |
| | | 3 | 4 | 4 | | 0 | 0 | | 4 | 2 | 2 | 0 | | |
| | | 2 | 2 | 6 | | -4 | 0 | | 2 | 4 | -2 | 0 | | |
| | | 1 | 0 | 8 | | -8 | 1 | | 0 | 6 | -6 | 1 | | |
| 0.5 | 7.5 | 4 | 6 | 2 | -7 | 4 | 0 | 0 | 6 | 0 | 6 | 0 | -1 | 0 |
| | | 3 | 4 | 4 | | 0 | 0 | | 4 | 2 | 2 | 0 | | |
| | | 2 | 2 | 6 | | -4 | 0 | | 2 | 4 | -2 | 0 | | |
| | | 1 | 0 | 8 | | -8 | 1 | | 0 | 6 | -6 | 0 | | |

ANALOG-DIGITAL CONVERTER AND CONTROL METHOD

PRIORITY

This application claims the priority and benefit of U.S. Provisional Application No. 62/180,837, filed on Jun. 17, 2015, the entire content of which is incorporated by reference herein.

TECHNICAL FIELD

This disclosure relates to an analog-digital converter and a control method.

BACKGROUND

A successive approximation analog-digital converter (ADC) generates different reference voltages with an internal digital-analog converter (DAC) and compares the voltage of an analog signal to be converted with the reference voltages in order to generate a digital signal corresponding to the voltage of the analog signal to be converted. An example of a successive approximation ADC has a resolution corresponding to the number of passive components in the internal DAC, i.e. a resolution of N bits for $2^N$ passive components (where N is a natural number).

In order to increase the resolution of such successive approximation ADC, a greater number of passive components needs to be provided in the internal DAC. Increasing the number of passive components in the DAC, however, raises manufacturing costs. Furthermore, conversion speed decreases and power consumption increases due to the increased time constant during analog-digital conversion.

SUMMARY

It would therefore be helpful to provide a more efficient analog-digital converter and control method therefor.

An analog-digital converter according to one aspect of this disclosure includes a digital-analog converter configured to output a differential voltage between a reference voltage and a voltage of an analog signal; a comparator configured to output a comparison signal corresponding to the differential voltage output by the digital-analog converter; and a register configured to cause the digital-analog converter to generate N pairs of differential voltages, where N is an integer greater than or equal to one, to cause the digital-analog converter to generate an $(N+1)^{th}$ pair of differential voltages by causing one of a positive side and a negative side of the digital-analog converter to output an $(N+1)^{th}$ differential voltage and causing the other of the positive side and the negative side to output a differential voltage equal to an $N^{th}$ differential voltage as an $(N+1)^{th}$ differential voltage, and to output a digital signal corresponding to a smallest comparison signal having a smallest voltage among (N+1) of the comparison signals. It is noted that as used in this disclosure, "register" refers to a circuit with storage elements used to control a converter.

In the above aspect, the digital-analog converter may be a differential digital-analog converter comprising a pair of converters that each include (N+1) passive components, input the reference voltage and the voltage of the analog signal into the passive components, and generate N differential voltages between the reference voltage and the voltage of the analog signal.

In the above aspect, the register may cause one passive component in one converter of the pair of converters to connect to the reference voltage and output the $(N+1)^{th}$ differential voltage.

The above aspect may further include a decoder configured to input a digital signal into the digital-analog converter based on a signal acquired from the register.

In the above aspect, the passive components in the pair of converters may be capacitors, resistors, or a combination of capacitors and resistors.

In the above aspect, the passive components in the pair of converters may be configured with a binary system or a segmented system.

In the above aspect, the analog signal may be a differential signal or a single end signal.

In the above aspect, the analog-digital converter may include a plurality of the comparators.

In the above aspect, two reference voltages with different voltage levels may be connected via a switch to an input terminal on one of a positive side and a negative side in the comparators.

In the above aspect, the register may switch the reference voltage connected to the input terminal by controlling the switch when causing the digital-analog converter to output the $(N+1)^{th}$ differential voltage.

A control method according to one aspect of this disclosure is a control method used in an analog-digital converter including a digital-analog converter, a comparator, and a register, the control method including the digital-analog converter outputting a differential voltage between a reference voltage and a voltage of an analog signal; the comparator outputting a comparison signal corresponding to the differential voltage output by the digital-analog converter; the register causing the digital-analog converter to generate N pairs of differential voltages, where N is an integer greater than or equal to one; the register causing the digital-analog converter to generate an $(N+1)^{th}$ pair of differential voltages by causing one of a positive side and a negative side of the digital-analog converter to output an $(N+1)^{th}$ differential voltage and causing the other of the positive side and the negative side to output a differential voltage equal to an $N^{th}$ differential voltage as an $(N+1)^{th}$ differential voltage; and the register outputting a digital signal corresponding to a smallest comparison signal having a smallest voltage among (N+1) of the comparison signals.

In the above aspect, the digital-analog converter may include a pair of converters that each include (N+1) passive components, and the above aspect may further include the converters each inputting the reference voltage and the voltage of the analog signal into the passive components and generating N differential voltages between the reference voltage and the voltage of the analog signal.

The above aspect may further include the register causing one passive component in one converter of the pair of converters to connect to the reference voltage and output the $(N+1)^{th}$ differential voltage.

In the above aspect, the analog-digital converter may include a decoder, and the control method may further include the decoder inputting a digital signal into the digital-analog converter based on a signal acquired from the register.

In the above aspect, the passive components in the pair of converters may be capacitors, resistors, or a combination of capacitors and resistors.

In the above aspect, the passive components in the pair of converters may be configured with a binary system or a segmented system.

In the above aspect, the analog signal may be a differential signal or a single end signal.

In the above aspect, the analog-digital converter may include a plurality of the comparators.

In the above aspect, two reference voltages with different voltage levels may be connected via a switch to an input terminal on one of a positive side and a negative side in the comparators.

The above aspect may further include the register switching the reference voltage connected to the input terminal by controlling the switch when causing the digital-analog converter to output the $(N+1)^{th}$ differential voltage.

The analog-digital converter and control method according to the embodiments below are more efficient by using fewer passive components to improve accuracy, while reducing manufacturing costs, increasing conversion speed, and reducing power consumption.

BRIEF DESCRIPTION OF THE DRAWINGS

In the accompanying drawings:

FIG. 11 illustrates signals input into the differential 2-bit DAC of FIG. 9;

FIG. 12 illustrates an example of digital output by the successive approximation ADC of FIG. 9;

FIG. 15 illustrates signals input into the differential 3-bit DAC of FIG. 13;

FIG. 16 illustrates an example of digital output by the successive approximation ADC of FIG. 13;

FIG. 21 illustrates signals input into the 1-bit capacitive DAC of FIG. 19;

FIG. 22 illustrates signals input to and output from the 3-bit resistive DAC of FIG. 19;

FIG. 23 illustrates an example of digital output by the successive approximation ADC of FIG. 19 in the case of inputting a single end signal;

FIG. 24 illustrates an example of digital output by the successive approximation ADC of FIG. 19 in the case of inputting a differential signal;

FIG. 26 illustrates an example of the control state of each switch in the differential comparator circuit illustrated in FIG. 25; and FIG. 27 illustrates an example of digital output of a 3-bit flash ADC.

DETAILED DESCRIPTION

The following describes the disclosed embodiments with reference to the drawings.

Embodiment 1

Figure 1:
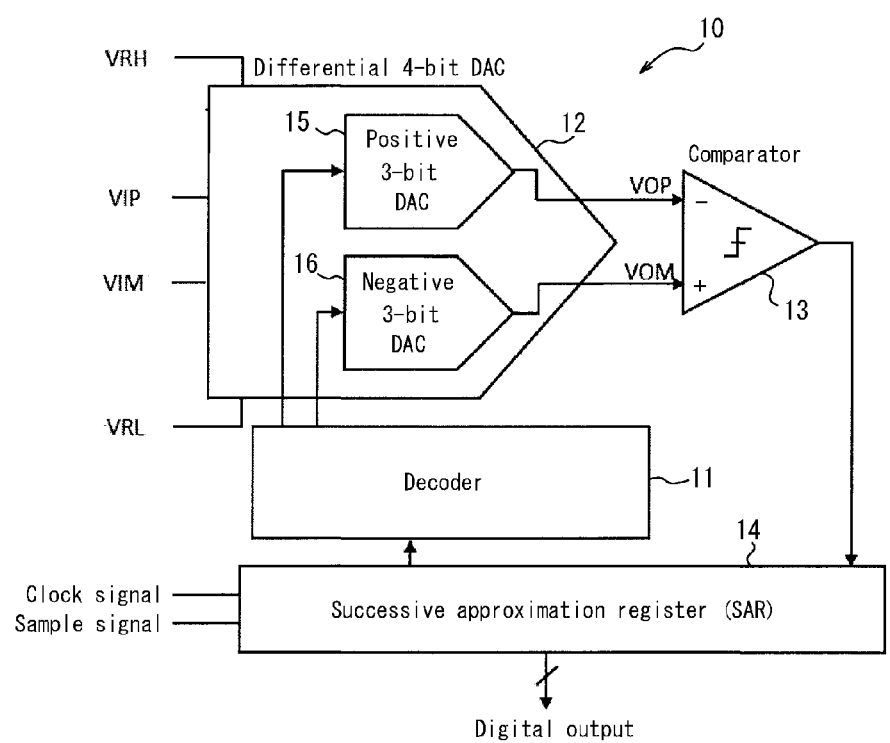
FIG. 1 is a functional block diagram illustrating an example of a 4-bit successive approximation ADC according to Embodiment 1.

FIG. 1 is a functional block diagram illustrating an example of a successive approximation ADC according to one of the disclosed embodiments. The successive approximation ADC of this embodiment is a 4-bit successive approximation ADC having a resolution of four bits. A 4-bit successive approximation ADC 10 includes a decoder 11, a differential 4-bit DAC 12, a comparator 13, and a successive approximation register (SAR) 14. Under the control of the SAR 14, the 4-bit successive approximation ADC 10 generates the differential voltage between the input analog voltage to be converted and a 4-bit resolution reference voltage with the differential 4-bit DAC 12 and the comparator 13 and tests whether the differential voltage is minimized, thereby generating and outputting a digital signal corresponding to the analog voltage. At this time, the differential 4-bit DAC 12 and the comparator 13 pass through a sampling phase and a trial phase with at least two trials. In this embodiment, the input analog signal to be converted is a differential signal having a voltage corresponding to the difference in potential between a positive analog signal VIP and a negative analog signal VIM. The reference voltage is the differential voltage between a high-voltage reference voltage VRH and a low-voltage reference voltage VRL supplied by a non-illustrated power source. Furthermore, the differential voltage to be tested (trial voltage), i.e. the difference between the analog voltage to be converted and the reference voltage, is the differential voltage between a positive analog output voltage VOP and a negative analog output voltage VOM, which are input into the comparator 13 from the differential 4-bit DAC 12.

The SAR 14 controls the overall analog-digital conversion processing by the 4-bit successive approximation ADC 10. A clock signal and a sample signal are input into the SAR 14. The sample signal is a signal that controls sampling. When the sample signal is on, the SAR 14 executes processing for the sampling phase in the differential 4-bit DAC 12, and when the sample signal is off, the SAR 14 executes processing for the trial phase in the differential 4-bit DAC 12. The SAR 14 generates a signal for controlling processing for successive approximation in the differential 4-bit DAC 12 and the comparator 13 and outputs the signal to the decoder 11. The signal output by the SAR 14 is referred to below as a control signal for successive approximation processing.

Based on the control signal for successive approximation processing obtained from the SAR 14, the decoder 11 inputs, into the differential 4-bit DAC 12, signals for controlling the on/off operation of each switch provided in the differential 4-bit DAC 12.

In response to the switch control signals input from the decoder 11 as digital signals, the differential 4-bit DAC 12 generates the positive analog output voltage VOP and the negative analog output voltage VOM based on a positive analog input voltage VIP and a negative analog input voltage VIM input into the differential 4-bit DAC 12 and on the high-voltage reference voltage VRH and the low-voltage reference voltage VRL input into the differential 4-bit DAC 12. The positive analog output voltage VOP and the negative analog output voltage VOM respectively represent the differential voltage between the high-voltage reference voltage VRH and the positive analog input voltage VIP and the differential voltage between the low-voltage reference voltage VRL and the negative analog input voltage VIM in each trial of the trial phase.

In this embodiment, the positive analog output voltage VOP and the negative analog output voltage VOM output by the differential 4-bit DAC 12 are respectively generated by a positive 3-bit DAC 15 and a negative 3-bit DAC 16 included in the differential 4-bit DAC 12. In response to the switch control signal input from the decoder 11, the positive 3-bit DAC 15 generates the positive analog output voltage VOP from the high-voltage reference voltage VRH and the positive analog input voltage VIP. In response to the switch control signal input from the decoder 11, the negative 3-bit DAC 16 generates the negative analog output voltage VOM from the low-voltage reference voltage VRL and the negative analog input voltage VIM. In this embodiment, the positive 3-bit DAC 15 and the negative 3-bit DAC 16 execute 4-bit processing to convert the switch control signal into the analog output voltage.

Figure 2:
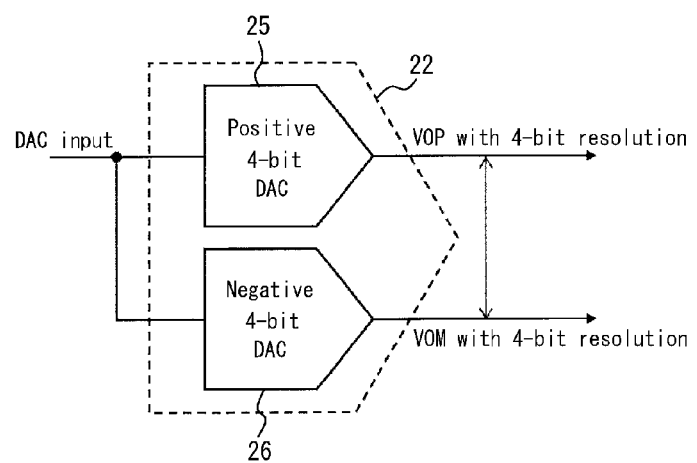
FIG. 2 is a functional block diagram illustrating an example of a differential 4-bit DAC provided with 4-bit DACs.
Figure 3:
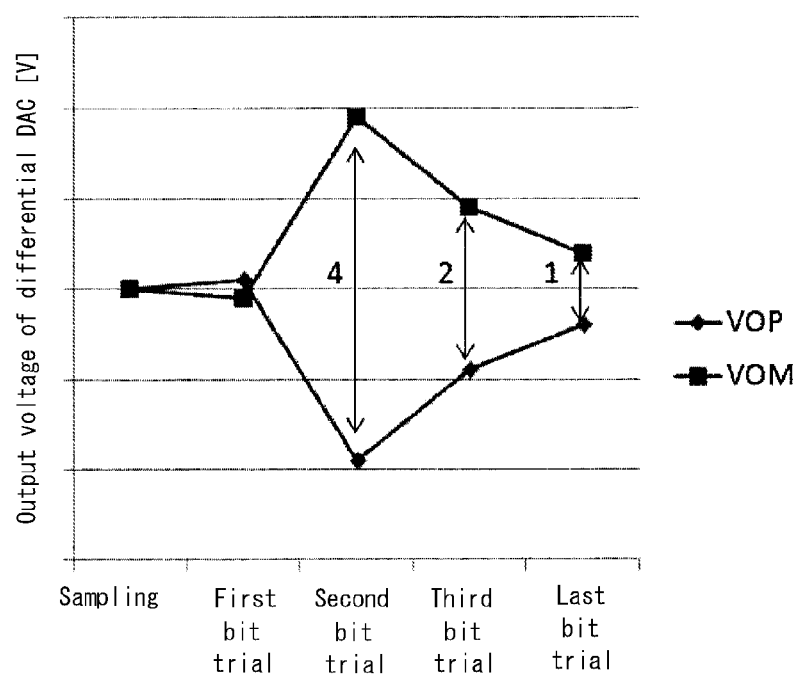
FIG. 3 illustrates analog voltage output by the differential 4-bit DAC of FIG. 2.

As an example related to this embodiment, an example using a 4-bit DAC to output analog voltage with 4-bit resolution is described using FIGS. 2 and 3. FIGS. 2 and 3 illustrate output of analog voltage with 4-bit resolution by a differential 4-bit DAC that includes 4-bit DACs. The differential 4-bit DAC 22 illustrated in FIG. 2 includes a positive 4-bit DAC 25 and a negative 4-bit DAC 26.

FIG. 3 illustrates trial voltage output by the differential 4-bit DAC 22 illustrated in FIG. 2. In FIG. 3, the vertical axis represents the voltage level of the analog output voltages VOP and VOM output by the differential 4-bit DAC 22, and the horizontal axis represents the passage of time by processing phases executed by the differential 4-bit DAC 22. As illustrated in FIG. 3, the differential 4-bit DAC 22 first samples the analog input signal that is input into the differential 4-bit DAC 22 (sampling phase) and then performs trials from the first bit trial to the fourth (last) bit trial (trial phase). By performing these four trials, the differential 4-bit DAC 22 outputs the positive analog output voltage VOP and negative analog output voltage VOM with 4-bit resolution. In this example, the trial voltage that is the differential voltage between the positive analog output voltage VOP and the negative analog output voltage VOM is shown changing from nearly 0 V to 4 V, 2 V, and 1 V from the first bit trial to the last (fourth) bit trial. In this way, analog-digital conversion is achieved by performing trials at the resolution corresponding to the number of bits and using the digital value corresponding to the reference voltage when the trial voltage is minimized, i.e. when the difference between the analog input voltage and the reference voltage is minimized.

Figure 4:
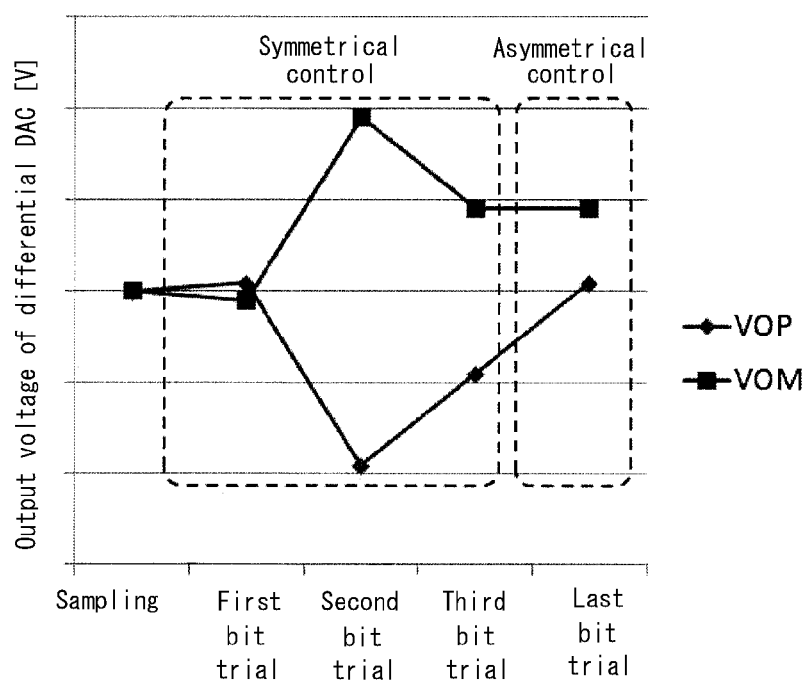
FIG. 4 illustrates the positive analog output voltage and negative analog output voltage output by the differential 4-bit DAC of FIG. 1.

FIG. 4 illustrates the positive analog output voltage VOP and negative analog output voltage VOM output by the differential 4-bit DAC 12 (of FIG. 1) in this embodiment. In FIG. 4, the vertical axis represents the voltage level of the analog output voltages output by the differential 4-bit DAC 12, and the horizontal axis represents the passage of time by processing phases executed by the differential 4-bit DAC 12. As illustrated in FIG. 4, the differential 4-bit DAC 12 first samples the analog input signal. The differential 4-bit DAC 12 then performs the first through third bit trails by symmetrically controlling the positive 3-bit DAC 15 and the negative 3-bit DAC 16.

Finally, the differential 4-bit DAC 12 performs the last bit trial. In the last bit trial, asymmetrical control is performed on the positive 3-bit DAC 15 and the negative 3-bit DAC 16. In greater detail, in the last bit trial, similar control to the control in the third bit trial is performed on the negative 3-bit DAC 16, whereas control differing from the control in the third bit trial is performed on the positive 3-bit DAC 15. In other words, control is only performed on the positive side in the last bit trial, unlike the first through the third bit trials in which control is performed on both the positive and negative sides. By performing such asymmetrical control, the differential 4-bit DAC 12 generates a positive analog output voltage VOP and negative analog output voltage VOM that are asymmetrical in the last bit trial, unlike the symmetrical positive analog output voltage VOP and negative analog output voltage VOM output in the first to third trials. In this way, with the positive 3-bit DAC 15 and negative 3-bit DAC 16 that have 3-bit resolution, the differential 4-bit DAC 12 achieves conversion to a 4-bit resolution digital signal in the ADC. In other words, the trial voltage that is the differential voltage between the positive analog output voltage VOP and the negative analog output voltage VOM is shown changing from the first bit trial to the last (fourth) bit trial. Analog-digital conversion is performed by using the digital value corresponding to the reference voltage when the trial voltage is minimized, i.e. when the difference between the analog input voltage and the reference voltage is minimized.

The circuit structure of the positive 3-bit DAC 15 and the negative 3-bit DAC 16 that achieve the above-described asymmetrical control during the last bit trial is described below.

Referring again to FIG. 1, the comparator 13 compares the positive analog output voltage VOP and the negative analog output voltage VOM obtained from the differential 4-bit DAC 12 and outputs a signal corresponding to the result of comparison (also referred to below simply as a "comparison signal"). In greater detail, the comparator 13 outputs a comparison signal corresponding to the trial voltage that is the difference between the positive analog output voltage VOP and the negative analog output voltage VOM.

The SAR 14 stores the comparison signal output from the comparator 13. Upon obtaining the comparison signal with 4-bit resolution from the comparator 13 and storing the comparison signal, based on the comparison signal the SAR 14 outputs a digital signal of the value corresponding to the reference voltage when the trial voltage is minimized, i.e. when the difference between the analog input voltage and the reference voltage is minimized.

Figure 5:
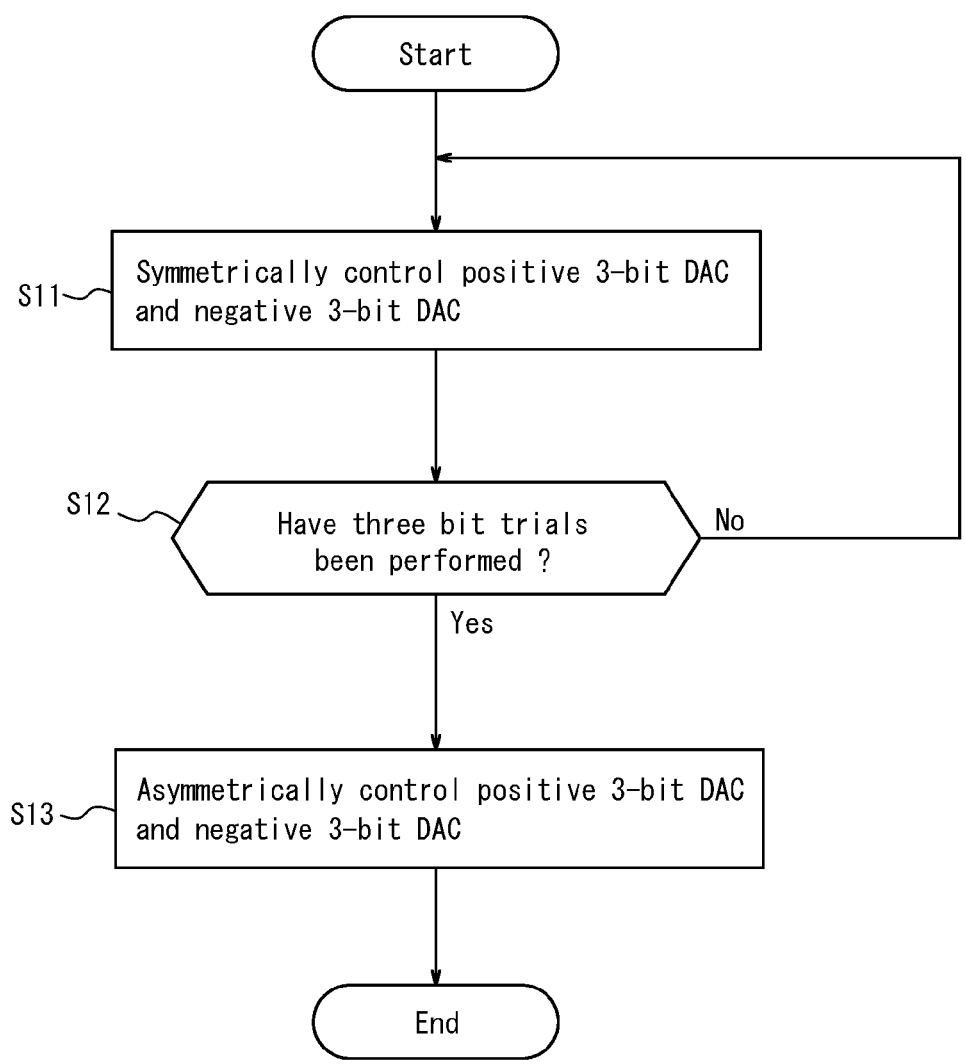
FIG. 5 is a flowchart illustrating an example control method executed by the differential 4-bit DAC of FIG. 1.

FIG. 5 is a flowchart illustrating an example of control method executed by the differential 4-bit DAC 12 of FIG. 1.

First, the differential 4-bit DAC 12 symmetrically controls the positive 3-bit DAC 15 and the negative 3-bit DAC 16 (step S11).

Next, the differential 4-bit DAC 12 determines whether three bit trials have been performed (step S12). The differential 4-bit DAC 12 determines whether three bit trials have been performed for example based on whether the below-described signal CTL has been input into the differential 4-bit DAC 12 from the decoder 11.

When determining that three bit trials have not been performed (step S12: No), then the differential 4-bit DAC 12 repeats step S11 and step S12 until determining in step S12 that three bit trials have been performed.

When determining that three bit trials have been performed (step S12: Yes), the differential 4-bit DAC 12 asymmetrically controls the positive 3-bit DAC 15 and the negative 3-bit DAC 16 as the last bit trial (step S13). The processing then terminates.

Since the above description of FIG. 5 is based on the differential 4-bit DAC 12 illustrated in FIG. 1, the differential 4-bit DAC 12 has been described as determining in step S12 whether three bit trials have been performed. For example, a differential (N+1)-bit DAC, however, would determine in step S12 whether N bit trials have been performed, where N is an integer greater than or equal to one.

Next, the circuit structure of the differential 4-bit DAC is described. First, with reference to FIG. 6, the circuit structure of the differential 4-bit DAC 22 illustrated in FIG. 2 is described.

Figure 6:
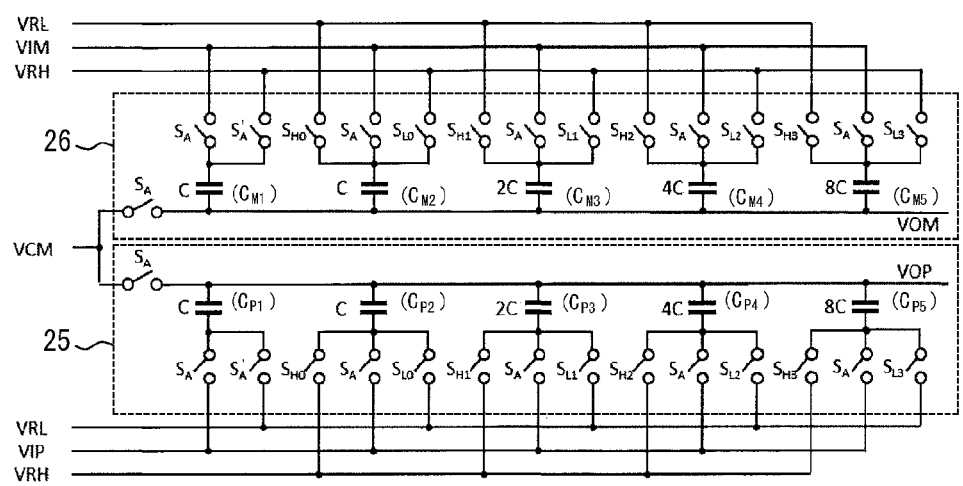
FIG. 6 illustrates an example of the circuit structure of the differential 4-bit DAC of FIG. 2.

In the example illustrated in FIG. 6, in the differential 4-bit DAC 22, the positive 4-bit DAC 25 and the negative 4-bit DAC 26 each include five capacitors as passive components. In FIG. 6, the 10 capacitors are indicated as capacitors with capacitances of C, C, 2C, 4C, and 8C. Below, the capacitors $C_{P1}$, $C_{P2}$, $C_{P3}$, $C_{P4}$, and $C_{P5}$ in the positive 4-bit DAC 25 respectively have capacitances of C, C, 2C, 4C, and 8C. The capacitors $C_{M1}$, $C_{M2}$, $C_{M3}$, $C_{M4}$, and $C_{M5}$ in the negative 4-bit DAC 26 respectively have capacitances of C, C, 2C, 4C, and 8C.

In the positive 4-bit DAC 25, the capacitor $C_{P1}$ is connected to the positive analog input voltage VIP and the low-voltage reference voltage VRL respectively via the switches $S_A$ and $S_A'$. The capacitors $C_{P2}$, $C_{P3}$, $C_{P4}$, and $C_{P5}$ are connected in parallel to the positive analog input voltage VIP, the high-voltage reference voltage VRH, and the low-voltage reference voltage VRL. The capacitors $C_{P2}$, $C_{P3}$, $C_{P4}$, and $C_{P5}$ are connected to the positive analog input voltage VIP via respective switches $S_A$. The capacitors $C_{P2}$, $C_{P3}$, $C_{P4}$, and $C_{P5}$ are connected to the high-voltage reference voltage VRH respectively via the switches $S_{H0}$, $S_{H1}$, $S_{H2}$, and $S_{H3}$. The capacitors $C_{P2}$, $C_{P3}$, $C_{P4}$, and $C_{P5}$ are connected to the low-voltage reference voltage VRL respectively via the switches $S_{L0}$, $S_{L1}$, $S_{L2}$, and $S_{L3}$. The capacitors $C_{P1}$, $C_{P2}$, $C_{P3}$, $C_{P4}$, and $C_{P5}$ are connected to an input common voltage VCM of the comparator via the switch $S_A$.

In the negative 4-bit DAC 26 as well, so as to be symmetrical with the positive 4-bit DAC 25, the capacitor $C_{M1}$ is connected to the negative analog input voltage VIM and the high-voltage reference voltage VRH respectively via the switches $S_A$ and $S_A'$. The capacitors $C_{M2}$, $C_{M3}$, $C_{M4}$, and $C_{M5}$ are connected in parallel to the negative analog input voltage VIM, the high-voltage reference voltage VRH, and the low-voltage reference voltage VRL. The capacitors $C_{M2}$, $C_{M3}$, $C_{M4}$, and $C_{M5}$ are connected to the negative analog input voltage VIM via respective switches $S_A$. The capacitors $C_{M2}$, $C_{M3}$, $C_{M4}$, and $C_{M5}$ are connected to the high-voltage reference voltage VRH respectively via the switches $S_{L0}$, $S_{L1}$, $S_{L2}$, and $S_{L3}$. The capacitors $C_{M2}$, $C_{M3}$, $C_{M4}$, and $C_{M5}$ are connected to the low-voltage reference voltage VRL respectively via the switches $S_{H0}$, $S_{H1}$, $S_{H2}$, and $S_{H3}$. The capacitors $C_{M1}$, $C_{M2}$, $C_{M3}$, $C_{M4}$, and $C_{M5}$ are connected to the input common voltage VCM of the comparator via the switch $S_A$.

In the differential 4-bit DAC 22, switches labeled with the same reference sign perform the same on/off operation.

In the differential 4-bit DAC 22 illustrated in FIG. 6, when sampling, the switches $S_A$ in the positive 4-bit DAC 25 and the negative 4-bit DAC 26 are controlled to be in a closed state, i.e. on state (referred to below simply as "on"), whereas the other switches are controlled to be in a closed state, i.e. off state (referred to below simply as "off"). When the switches $S_A$ are on, a charge corresponding to the positive analog input voltage VIP accumulates in all of the capacitors $C_{P1}$, $C_{P2}$, $C_{P3}$, $C_{P4}$, and $C_{P5}$ in the positive 4-bit DAC 25, and a charge corresponding to the negative analog input voltage VIM accumulates in all of the capacitors $C_{M1}$, $C_{M2}$, $C_{M3}$, $C_{M4}$, and $C_{M5}$ in the negative 4-bit DAC 26.

Next, when the differential 4-bit DAC 22 performs the first bit trial, the switches $S_A'$, $S_{L0}$, $S_{L1}$, $S_{L2}$, and $S_{H3}$ are turned on, and the other switches are turned off. By the switches $S_A'$ turning on, the capacitor $C_{P1}$ is connected to the low-voltage reference voltage VRL, and the capacitor $C_{M1}$ is connected to the high-voltage reference voltage VRH. By the switches $S_{L0}$, $S_{L1}$, and $S_{L2}$ turning on, the capacitors $C_{P2}$, $C_{P3}$, and $C_{P4}$ are connected to the low-voltage reference voltage VRL, and the capacitors $C_{M2}$, $C_{M3}$, and $C_{M4}$ are connected to the high-voltage reference voltage VRH. By the switches $S_{H3}$ turning on, the capacitor $C_{P5}$ is connected to the high-voltage reference voltage VRH, and the capacitor $C_{M5}$ is connected to the low-voltage reference voltage VRL. By the switches $S_A$ turning off, the capacitors $C_{P1}$, $C_{P2}$, $C_{P3}$, $C_{P4}$, and $C_{P5}$ in the positive 4-bit DAC 25 are disconnected from the positive analog input voltage VIP, and the capacitors $C_{M1}$, $C_{M2}$, $C_{M3}$, $C_{M4}$, and $C_{M5}$ in the negative 4-bit DAC 26 are disconnected from the negative analog input voltage VIM.

In the first bit trial, as a result of the above-described on/off control of the switches, the positive analog output voltage VOP that is output is the difference in potential between the positive analog input voltage VIP and the reference voltage that is determined by the capacitors $C_{P1}$, $C_{P2}$, $C_{P3}$, $C_{P4}$, and $C_{P5}$ and the connection with the high-voltage reference voltage VRH or the low-voltage reference voltage VRL.

Similarly on the negative side, the negative analog output voltage VOM that is output is the difference in potential between the negative analog input voltage VIM and the reference voltage that is determined by the capacitors $C_{M1}$, $C_{M2}$, $C_{M3}$, $C_{M4}$, and $C_{M5}$ and the connection with the high-voltage reference voltage VRH or the low-voltage reference voltage VRL.

Next, when the differential 4-bit DAC 22 performs the second bit trial, based on the result of the first bit trial, either the switches $S_{H3}$ are turned on and the switches $S_{L3}$ are turned off, or vice-versa. Furthermore, the switches $S_{L2}$ are turned off, and the switches $S_{H2}$ are turned on. In other words, in the second bit trial, the capacitor $C_{P4}$ is disconnected from the low-voltage reference voltage VRL and is electrically connected to the high-voltage reference voltage VRH. In the second bit trial, the capacitor $C_{M4}$ is electrically disconnected from the high-voltage reference voltage VRH and connected to the low-voltage reference voltage VRL. In the second bit trial as well, as in the first bit trial, the difference in potential between the reference voltage and the positive analog input voltage VIP is output as the positive analog output voltage VOP, and the difference in potential between the reference voltage and the negative analog input voltage VIM is output as the negative analog output voltage VOM.

Next, when the differential 4-bit DAC 22 performs the third bit trial, based on the result of the second bit trial, either the switches $S_{H2}$ are turned on and the switches $S_{L2}$ are turned off, or vice-versa. Furthermore, the switches $S_{L1}$ are turned off, and the switches $S_{H1}$ are turned on. In other words, in the third bit trial, the capacitor $C_{P3}$ is disconnected from the low-voltage reference voltage VRL and is connected to the high-voltage reference voltage VRH. In the third bit trial, the capacitor $C_{M3}$ is disconnected from the high-voltage reference voltage VRH and connected to the low-voltage reference voltage VRL. In the third bit trial as well, as in the first bit trial, the difference in potential between the reference voltage and the positive analog input voltage VIP is output as the positive analog output voltage VOP, and the difference in potential between the reference voltage and the negative analog input voltage VIM is output as the negative analog output voltage VOM.

Finally, when the differential 4-bit DAC 22 performs the fourth bit trial, based on the result of the third bit trial, either the switches $S_{H1}$ are turned on and the switches $S_{L1}$ are turned off, or vice-versa. Furthermore, the switches $S_{L0}$ are turned off, and the switches $S_{H0}$ are turned on. In other words, in the fourth bit trial, the capacitor $C_{P2}$ is disconnected from the low-voltage reference voltage VRL and is connected to the high-voltage reference voltage VRH. In the fourth bit trial, the capacitor $C_{M2}$ is disconnected from the high-voltage reference voltage VRH and electrically connected to the low-voltage reference voltage VRL. In the fourth bit trial as well, as in the first bit trial, the difference in potential between the reference voltage and the positive analog input voltage VIP is output as the positive analog output voltage VOP, and the difference in potential between the reference voltage and the negative analog input voltage VIM is output as the negative analog output voltage VOM.

By performing the first through fourth bit trials with the above-described on/off operations of the switches, the differential 4-bit DAC 22 outputs the positive analog output voltage VOP and negative analog output voltage VOM with 4-bit resolution.

The positive analog output voltage VOP and negative analog output voltage VOM output from the differential 4-bit DAC 22 are then compared in the comparator 13. In greater detail, the comparator 13 amplifies and outputs the differential voltage between the positive analog output voltage VOP and the negative analog output voltage VOM. The trial voltage corresponding to the difference between the positive analog output voltage VOP and the negative analog output voltage VOM corresponds to the difference between the differential voltage between the high-voltage reference voltage VRH and the low-voltage reference voltage VRL (VRH–VRL) and the differential voltage between the positive analog input voltage VIP and the negative analog input voltage VIM (VIP–VIM). The digital signal corresponding to the reference voltage for which this difference is closest to zero is output from the ADC.

Figure 7:
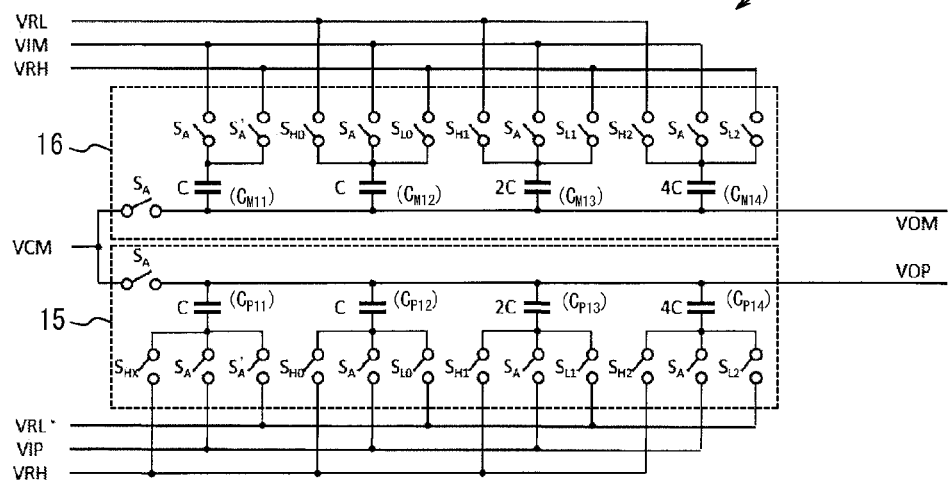
FIG. 7 illustrates an example of the circuit structure of the differential 4-bit DAC of FIG. 1.

By contrast, the circuit in the differential 4-bit DAC 12 of this embodiment is structured as illustrated in FIG. 7. In the example illustrated in FIG. 7, as in the example illustrated in FIG. 6, the passive components are capacitors and are structured according to a binary system. In greater detail, the positive 3-bit DAC 15 and negative 3-bit DAC 16 each include four capacitors as passive components. The capacitors $C_{P11}$, $C_{P12}$, $C_{P13}$, and $C_{P14}$ in the positive 3-bit DAC 15 respectively have capacitances of C, C, 2C, and 4C. The capacitors $C_{M11}$, $C_{M12}$, $C_{M13}$, and $C_{M14}$ in the negative 3-bit DAC 16 respectively have capacitances of C, C, 2C, and 4C. The passive components may be structured according to a system other than the binary system. For example, individual passive components may be connected in parallel in a segmented system or may be structured according to any other system. The DAC may also be structured using resistors as the passive components.

In the positive 3-bit DAC 15, the capacitor $C_{P11}$ is connected to the positive analog input voltage VIP and the low-voltage reference voltage VRL respectively via the switches $S_A$ and $S_A'$. The capacitor $C_{P11}$ is further connected to the high-voltage reference voltage VRH via a switch $S_{HX}$. The capacitors $C_{P12}$, $C_{P13}$, and $C_{P14}$ are connected in parallel to the positive analog input voltage VIP, the high-voltage reference voltage VRH, and the low-voltage reference voltage VRL. The capacitors $C_{P12}$, $C_{P13}$, and $C_{P14}$ are connected to the positive analog input voltage VIP via respective switches $S_A$. The capacitors $C_{P12}$, $C_{P13}$, and $C_{P14}$ are connected to the high-voltage reference voltage VRH respectively via the switches $S_{H0}$, $S_{H1}$, and $S_{H2}$. The capacitors $C_{P12}$, $C_{P13}$, and $C_{P14}$ are connected to the low-voltage reference voltage VRL respectively via the switches $S_{L0}$, $S_{L1}$, and $S_{L2}$. The capacitors $C_{P11}$, $C_{P12}$, $C_{P13}$, and $C_{P14}$ are connected to the input common voltage VCM of the comparator via the switch $S_A$.

On the other hand, in the negative 3-bit DAC 16, the capacitor $C_{M11}$ is connected to the negative analog input voltage VIM and the high-voltage reference voltage VRH respectively via the switches $S_A$ and $S_A'$. The capacitors $C_{M12}$, $C_{M13}$, and $C_{M14}$ are connected in parallel to the negative analog input voltage VIM, the high-voltage reference voltage VRH, and the low-voltage reference voltage VRL. The capacitors $C_{M12}$, $C_{M13}$, and $C_{M14}$ are connected to the negative analog input voltage VIM via respective switches $S_A$. The capacitors $C_{M12}$, $C_{M13}$, and $C_{M14}$ are connected to the high-voltage reference voltage VRH respectively via the switches $S_{L0}$, $S_{L1}$, and $S_{L2}$. The capacitors $C_{M12}$, $C_{M13}$, and $C_{M14}$ are connected to the low-voltage reference voltage VRL respectively via the switches $S_{H0}$, $S_{H1}$, and $S_{H2}$. The capacitors $C_{M11}$, $C_{M12}$, $C_{M13}$, and $C_{M14}$ are connected to the input common voltage VCM of the comparator via the switch $S_A$.

In the differential 4-bit DAC 12, switches labeled with the same reference sign perform the same on/off operation, as in the differential 4-bit DAC 22.

In the differential 4-bit DAC 12 illustrated in FIG. 7, when sampling, the switches $S_A$ in the positive 3-bit DAC 15 and the negative 3-bit DAC 16 are controlled to be on, whereas the other switches are controlled to be off. In other words, by connection of the switches $S_A$, a charge corresponding to the positive analog input voltage VIP accumulates in all of the capacitors $C_{P11}$, $C_{P12}$, $C_{P13}$, and $C_{P14}$ in the positive 3-bit DAC 15. Furthermore, a charge corresponding to the negative analog input voltage VIM accumulates in all of the capacitors $C_{M11}$, $C_{M12}$, $C_{M13}$, and $C_{M14}$ in the negative 3-bit DAC 16.

Next, when the differential 4-bit DAC 12 performs the first bit trial, the switches $S_A'$, $S_{L0}$, $S_{L1}$, and $S_{H2}$ are turned on, and the other switches are turned off. By the switches $S_A'$ turning on, the capacitor $C_{P11}$ is connected to the low-voltage reference voltage VRL, and the capacitor $C_{M11}$ is connected to the high-voltage reference voltage VRH. By the switches $S_{L0}$ and $S_{L1}$ turning on, the capacitors $C_{P12}$ and $C_{P13}$ are connected to the low-voltage reference voltage VRL, and the capacitors $C_{M12}$ and $C_{M13}$ are connected to the high-voltage reference voltage VRH. By the switches $S_{H2}$ turning on, the capacitor $C_{P14}$ is connected to the high-voltage reference voltage VRH, and the capacitor $C_{M14}$ is connected to the low-voltage reference voltage VRL. By the switches $S_A$ turning off, the capacitors $C_{P11}$, $C_{P12}$, $C_{P13}$, and $C_{P14}$ in the positive 3-bit DAC 15 are disconnected from the positive analog input voltage VIP, and the capacitors $C_{M11}$, $C_{M12}$, $C_{M13}$, and $C_{M14}$ in the negative 3-bit DAC 16 are disconnected from the negative analog input voltage VIM.

In the first bit trial, the on/off operation of each switch is controlled as described above. As a result, the positive analog output voltage VOP that is output is the difference in potential between the positive analog input voltage VIP and the reference voltage that is determined by the capacitors $C_{P11}$, $C_{P12}$, $C_{P13}$, and $C_{P14}$ and the connection with the high-voltage reference voltage VRH or the low-voltage reference voltage VRL. In this way, the positive 3-bit DAC 15 converts the digital signal input from the decoder 11 (switch control signal) into an analog signal (positive analog output voltage VOP).

Similarly on the negative side, the negative analog output voltage VOM that is output is the difference in potential between the negative analog input voltage VIM and the reference voltage that is determined by the capacitors $C_{M11}$, $C_{M12}$, $C_{M13}$, and $C_{M14}$ and the connection with the high-voltage reference voltage VRH or the low-voltage reference voltage VRL. In this way, the negative 3-bit DAC 16 converts the digital signal input from the decoder 11 (switch control signal) into an analog signal (negative analog output voltage VOM).

Next, when the differential 4-bit DAC 12 performs the second bit trial, based on the result of the first bit trial, either the switches $S_{H2}$ are turned on and the switches $S_{L2}$ are turned off, or vice-versa. Furthermore, the switches $S_{L1}$ are turned off, and the switches $S_{H1}$ are turned on. In other words, in the second bit trial, the capacitor $C_{P13}$ is disconnected from the low-voltage reference voltage VRL and is connected to the high-voltage reference voltage VRH. In the second bit trial, the capacitor $C_{M13}$ is disconnected from the high-voltage reference voltage VRH and connected to the low-voltage reference voltage VRL. In the second bit trial as well, as in the first bit trial, the difference in potential between the reference voltage and the positive analog input voltage VIP is output as the positive analog output voltage VOP, and the difference in potential between the reference voltage and the negative analog input voltage VIM is output as the negative analog output voltage VOM.

Next, when the differential 4-bit DAC 12 performs the third bit trial, based on the result of the second bit trial, either the switches $S_{H1}$ are turned on and the switches $S_{L1}$ are turned off, or vice-versa. Furthermore, the switches $S_{L0}$ are turned off, and the switches $S_{H0}$ are turned on. In other words, in the third bit trial, the capacitor $C_{P12}$ is disconnected from the low-voltage reference voltage VRL and is connected to the high-voltage reference voltage VRH. In the third bit trial, the capacitor $C_{M12}$ is disconnected from the high-voltage reference voltage VRH and connected to the low-voltage reference voltage VRL. In the third bit trial as well, as in the first bit trial, the difference in potential between the reference voltage and the positive analog input voltage VIP is output as the positive analog output voltage VOP, and the difference in potential between the reference voltage and the negative analog input voltage VIM is output as the negative analog output voltage VOM.

Finally, the differential 4-bit DAC 12 performs an additional last bit trial. During the last bit trial, based on the result of the third bit trial, either the switches $S_{H0}$ are turned on and the switches $S_{L0}$ are turned off, or vice-versa. Furthermore, in the circuit of the positive 3-bit DAC 15 illustrated in FIG. 7, the switch $S_{HX}$ is turned on. In other words, in the last bit trial, the capacitor $C_{P11}$ is connected to the high-voltage reference voltage VRH. On the other hand, the negative 3-bit DAC 16 does not change from the third bit trial. In this way, since the on/off state of the switches in the negative 3-bit DAC 16 does not change in the last bit trial as compared to the third bit trial, the negative analog output voltage VOM does not change. On the other hand, by the switch $S_{HX}$ in the positive 3-bit DAC 15 turning on, the positive analog output voltage VOP is changed. In this way, by the positive 3-bit DAC 15 and the negative 3-bit DAC 16 operating asymmetrically, in the last bit trial the trial voltage that is the difference between the negative analog output voltage VOM and the positive analog output voltage VOP can be reduced from the trial voltage during the third bit trial, even though 3-bit DACs are used.

The positive analog output voltage VOP and negative analog output voltage VOM output from the differential 4-bit DAC 12 are then compared in the comparator 13. In greater detail, the comparator 13 amplifies and outputs the trial voltage that is the difference between the positive analog output voltage VOP and the negative analog output voltage VOM. The differential voltage between the positive analog output voltage VOP and the negative analog output voltage VOM corresponds to the difference between the differential voltage between the high-voltage reference voltage VRH and the low-voltage reference voltage VRL (VRH−VRL) and the differential voltage between the positive analog input voltage VIP and the negative analog input voltage VIM (VIP−VIM). The digital signal corresponding to the reference voltage when this difference is closest to zero is output from the 4-bit successive approximation ADC 10.

By the differential 4-bit DAC 12 controlling the positive 3-bit DAC 15 and the negative 3-bit DAC 16 asymmetrically during the last bit trial, the 4-bit successive approximation ADC 10 of this embodiment can convert an analog signal into a digital signal with 4-bit resolution. Therefore, as compared to the differential 4-bit DAC 22 that includes the positive 4-bit DAC 25 and the negative 4-bit DAC 26, the differential 4-bit DAC 12 can achieve output as a digital signal with 4-bit resolution using fewer passive components. By reducing the number of components in this way, the 4-bit successive approximation ADC 10 according to this embodiment can reduce manufacturing costs. Furthermore, by reducing the number of components, the time constant during analog-digital conversion is decreased, thereby increasing conversion speed. By reducing the number of components, the power consumption in the 4-bit successive approximation ADC 10 also decreases.

In this embodiment, a 4-bit successive approximation ADC that outputs a digital signal with 4-bit resolution using 3-bit DACs has been described, but this disclosure is not limited to this embodiment. According to this disclosure, based on the above-described principle, a successive approximation ADC that outputs a digital signal with N-bit resolution (N being an integer greater than or equal to two), i.e. an N-bit successive approximation ADC, can be achieved using (N−1)-bit DACs. In this case, the N-bit successive approximation ADC can output a digital signal with N-bit resolution by controlling a positive (N−1)-bit DAC and a negative (N−1)-bit DAC symmetrically until the (N−1)$^{th}$ bit trial and asymmetrically during the N$^{th}$ (last) bit trial. In other words, according to this embodiment, in a successive approximation ADC configured using the same number of passive components as a typical successive approximation ADC, one bit can be added to the resolution of the successive approximation ADC by adding one switch.

Figure 8A:
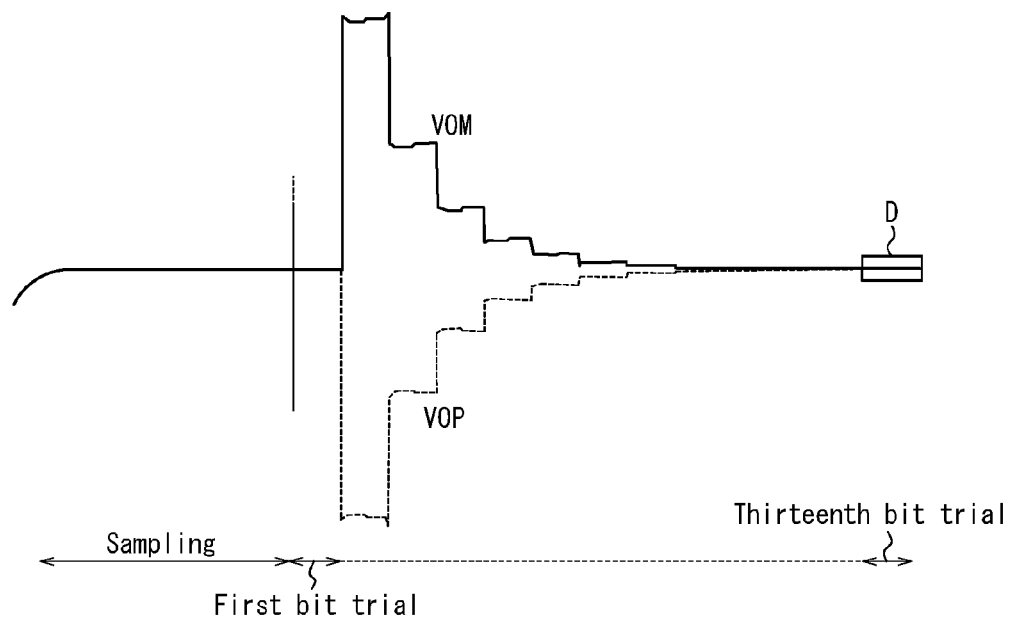
FIGS. 8A and 8B illustrate the results of an experiment performed using a 13-bit successive approximation ADC provided with a differential 13-bit DAC configured using 12-bit DACs.
Figure 8B:
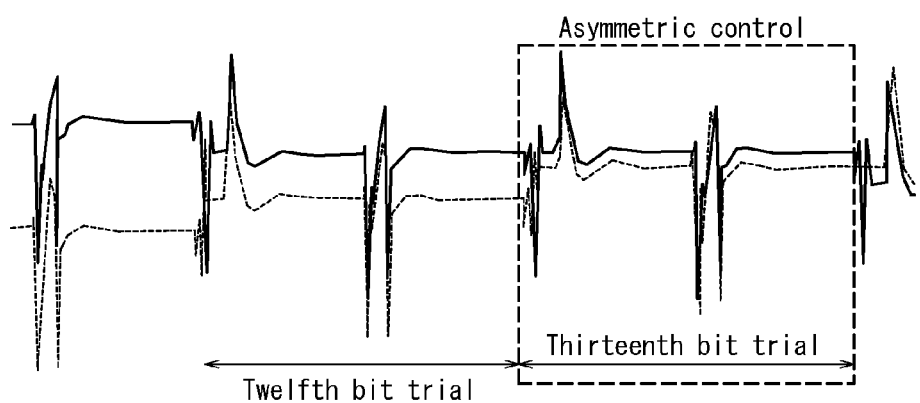

FIGS. 8A and 8B illustrate the results of an experiment performed using a 13-bit successive approximation ADC provided with a differential 13-bit DAC configured using 12-bit DACs, illustrating the positive analog output voltage VOP and the negative analog output voltage VOM from the differential 13-bit DAC. As illustrated in FIG. 8A, in the bit trials after sampling, the differential 13-bit DAC outputs the positive analog output voltage VOP and the negative analog output voltage VOM. FIG. 8B is an expanded view of area D in FIG. 8A. As illustrated in FIGS. 8A and 8B, from the first bit trial through the twelfth bit trial, positive analog output voltage VOP and negative analog output voltage VOM that are symmetrical are output. For the voltage that is output during the thirteenth (last) trial, the negative analog output voltage VOM is the same as the voltage output in the twelfth trial, whereas the positive analog output voltage VOP is higher than the voltage output in the twelfth trial and approaches the negative analog output voltage VOM.

Embodiment 2

In Embodiment 1, the positive analog input voltage VIP and the negative analog input voltage VIM are described as being differential signals, but the positive analog input voltage VIP and the negative analog input voltage VIM need not be differential signals. The positive analog input voltage VIP and the negative analog input voltage VIM may, for example, be single end signals. An example of the positive analog input voltage VIP and the negative analog input voltage VIM being single end signals is described as Embodiment 2 with comparison to a typical successive approximation ADC.

Figure 9:
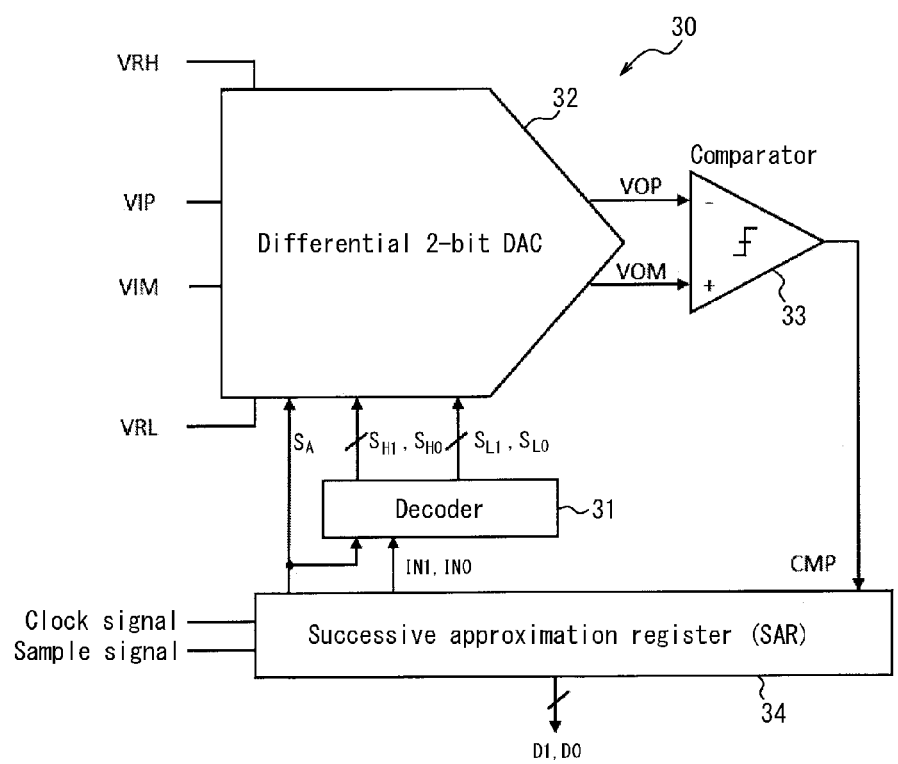
FIG. 9 is a functional block diagram illustrating an example of a successive approximation ADC.

FIG. 9 illustrates an example of a typical successive approximation ADC, namely a 2-bit successive approximation ADC that converts an analog signal to a digital signal with 2-bit resolution. The 2-bit successive approximation ADC 30 illustrated in FIG. 9 includes a decoder 31, a differential 2-bit DAC 32, a comparator 33, and a SAR 34. The functions of the decoder 31, differential 2-bit DAC 32, comparator 33, and SAR 34 are similar to those of the decoder 11, differential 4-bit DAC 12, comparator 13, and SAR 14 of Embodiment 1, and therefore a description thereof is omitted. The differential 2-bit DAC 32, however, differs from the differential 4-bit DAC 12 by outputting analog output voltage with 2-bit resolution.

The SAR 34 generates IN0 and IN1 as control signals for successive approximation processing and outputs the generated control signals for successive approximation processing to the decoder 31. The SAR 34 generates a signal S$_A$ and outputs the generated signal S$_A$ to the differential 2-bit DAC 32. The signal S$_A$ is a signal for performing on/off control of the switches S$_A$ illustrated in FIG. 10.

Based on the signals IN0 and IN1 input from the SAR 34, the decoder 31 generates signals S$_{H0}$, S$_{H1}$, S$_{L1}$, and S$_{L0}$ and outputs the generated signals to the differential 2-bit DAC 32. The signals S$_{H0}$, S$_{H1}$, S$_{L1}$, and S$_{L0}$ are signals for performing on/off control of the switches S$_{H0}$, S$_{H1}$, S$_{L1}$, and S$_{L0}$ illustrated in FIG. 10.

The comparison signal output by the comparator 33 is referred to as CMP.

The signals S$_A$, S$_A$', S$_{H0}$, S$_{H1}$, S$_{L1}$, and S$_{L0}$ are each output as either "1" indicating "on" or "0" indicating "off". The signals S$_A$ and S$_A$' perform mutually inverse on/off operations. In other words, when the signal S$_A$ is on, the signal S$_A$' is off, and when the signal S$_A$ is off, the signal S$_A$' is on.

The digital signal output from the 2-bit successive approximation ADC 30 is referred to as D$_{out}$.

Figure 10:
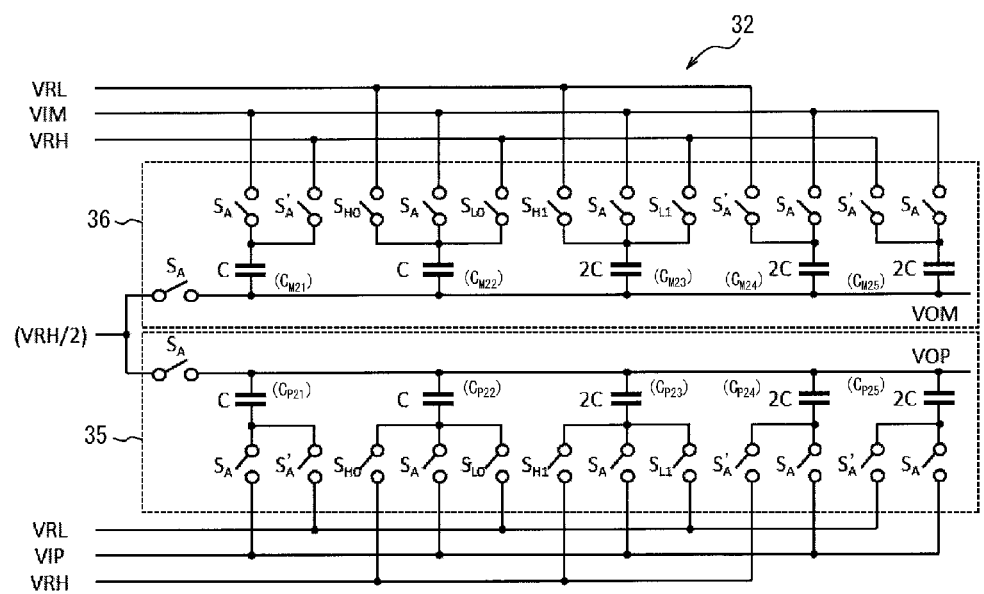
FIG. 10 illustrates an example of the circuit structure of the differential 2-bit DAC of FIG. 9.

FIG. 10 illustrates an example of the circuit structure of the differential 2-bit DAC 32 of FIG. 9. As illustrated in FIG. 10, the differential 2-bit DAC 32 includes a positive 2-bit DAC 35 and a negative 2-bit DAC 36. The positive 2-bit DAC 35 and the negative 2-bit DAC 36 each include five capacitors as passive components. The capacitors C$_{P21}$, C$_{P22}$, C$_{P23}$, C$_{P24}$, and C$_{P25}$ in the positive 2-bit DAC 35 respectively have capacitances of C, C, 2C, 2C, and 2C. The capacitors C$_{M21}$, C$_{M22}$, C$_{M23}$, C$_{M24}$, and C$_{M25}$ in the negative 2-bit DAC 36 respectively have capacitances of C, C, 2C, 2C, and 2C.

In the positive 2-bit DAC 35, the capacitor C$_{P21}$ is connected to the positive analog input voltage VIP and the low-voltage reference voltage VRL respectively via the switches S$_A$ and S$_A$'. The capacitor C$_{P22}$ is connected in parallel to the positive analog input voltage VIP, the high-voltage reference voltage VRH, and the low-voltage reference voltage VRL respectively via the switches S$_A$, S$_{H0}$, and S$_{L0}$. The capacitor C$_{P23}$ is connected in parallel to the positive analog input voltage VIP, the high-voltage reference voltage VRH, and the low-voltage reference voltage VRL respectively via the switches S$_A$, S$_{H1}$, and S$_{L1}$.

The capacitors C$_{P24}$ and C$_{P25}$ are connected to the positive analog input voltage VIP via respective switches S$_A$. The capacitor C$_{P24}$ is connected to the high-voltage reference voltage VRH via the switch S$_A$', and the capacitor C$_{P25}$ is connected to the low-voltage reference voltage VRL via the switch S$_A$'. The capacitors C$_{P21}$, C$_{P22}$, C$_{P23}$, C$_{P24}$, and C$_{P25}$ are connected to a fixed voltage via the switch S$_A$. The common voltage of the comparator input is fixed at VRH/2.

In the negative 2-bit DAC 36, the capacitor C$_{M21}$ is connected to the negative analog input voltage VIM and the high-voltage reference voltage VRH respectively via the switches S$_A$ and S$_A$'. The capacitor C$_{M22}$ is connected in parallel to the negative analog input voltage VIM, the low-voltage reference voltage VRL, and the high-voltage reference voltage VRH respectively via the switches S$_A$, S$_{H0}$, and S$_{L0}$. The capacitor C$_{M23}$ is connected in parallel to the negative analog input voltage VIM, the low-voltage reference voltage VRL, and the high-voltage reference voltage VRH respectively via the switches S$_A$, S$_{H1}$, and S$_{L1}$.

The capacitors C$_{M24}$ and C$_{M25}$ are connected to the negative analog input voltage VIM via respective switches S$_A$. The capacitor C$_{M24}$ is connected to the low-voltage reference voltage VRL via the switch S$_A$', and the capacitor C$_{M25}$ is connected to the high-voltage reference voltage VRH via the switch S$_A$'. The capacitors C$_{M21}$, C$_{M22}$, C$_{M23}$, C$_{M24}$, and C$_{M25}$ are connected to the fixed voltage VRH/2 via the switch S$_A$.

In the differential 2-bit DAC 32, the capacitors C$_{P24}$, C$_{P25}$, C$_{M24}$, and C$_{M25}$ are provided in order to match the differential voltage between the positive analog input voltage VIP and the negative analog input voltage VIM, which are single end signals, to the differential voltage between the high-voltage reference voltage VRH and the low-voltage reference voltage VRL. In other words, with the capacitors C$_{P24}$, C$_{P25}$, C$_{M24}$, and C$_{M25}$, even when the input voltage is a single end signal, the differential voltage between the positive analog input voltage VIP and the negative analog input voltage VIM becomes the same differential voltage as when the input voltage is a differential signal. Therefore, the resolution in the differential 2-bit DAC 32 can be maintained without any reduction.

Next, with reference to FIGS. 11 and 12, an example of each signal and of digital output in the 2-bit successive approximation ADC 30 is described. In FIGS. 11 and 12, the logic level of the signals IN0, IN1, and CMP is indicated as "0" or "1".

FIG. 11 illustrates signals input into the differential 2-bit DAC 32 of FIG. 9. In FIG. 11, the on/off states of the signals $S_A$, IN1, IN0, $S_{H1}$, $S_{H0}$, $S_{L1}$, and $S_{L0}$ in the sampling phase and the trial phase are indicated in table form. As illustrated in FIG. 11, in the sampling phase, only the signal $S_A$ is on, i.e. the switches $S_A$ in FIG. 10 are on. As a result, a charge corresponding to the positive analog input voltage VIP accumulates in the capacitors $C_{P21}$, $C_{P22}$, $C_{P23}$, $C_{P24}$, and $C_{P25}$ of the positive 2-bit DAC 35, and a charge corresponding to the negative analog input voltage VIM accumulates in the capacitors $C_{M21}$, $C_{M22}$, $C_{M23}$, $C_{M24}$, and $C_{M25}$ of the negative 2-bit DAC 36. In the trial phase, the signals $S_{L1}$ and $S_{L0}$ are controlled to be on/off inversely from the signals $S_{H1}$ and $S_{H0}$ respectively. Therefore, the switches $S_{L1}$ and $S_{L0}$ are controlled to be on/off inversely from the switches $S_{H1}$ and $S_{H0}$ respectively.

As can be seen from FIGS. 10 and 11, the positive 2-bit DAC 35 and negative 2-bit DAC 36 are controlled symmetrically by respectively inputting the same signals $S_{H1}$, $S_{H0}$, $S_{L1}$, and $S_{L0}$.

FIG. 12 illustrates an example of digital output by the successive approximation ADC 30 of FIG. 9. In this case, as an example of single end signals, FIG. 12 illustrates the digital output $D_{out}$ that is output in accordance with the value of the positive analog input voltage VIP when the high-voltage reference voltage VRH is 8 V, the low-voltage reference voltage VRL is 0 V, and the negative analog input voltage VIM is fixed at VRH/2. FIG. 12 illustrates the results for when the value of the positive analog input voltage VIP is 1 V, 3 V, 5 V, and 7 V.

In FIG. 12, the positive analog output voltage VOP and the negative analog output voltage VOM are calculated by Equations (1) and (2) below, which are derived from the law of conservation of charge.

$$VOP = VRH/2 - VIP + (1/8)*VRH*(2*S_{H1} + S_{H0} + 2) \quad (1)$$

$$VOM = VRH/2 - VIM + (1/8)*VRH*(2*S_{L1} + S_{L0} + 2) \quad (2)$$

In FIG. 12, the signals D1 and D0 are the comparison signal CMP in the first bit trial and the second bit trial respectively.

As illustrated in FIG. 12, when the positive analog input voltage VIP is 1 V, 3 V, 5 V, and 7 V, then based on the signals D1 and D0 output by the first bit trial and the second bit trial, $D_{out}$ takes the values of 0, 1, 2, and 3 respectively. In this way, the 2-bit successive approximation ADC 30 converts an analog signal to 2-bit digital output.

Figure 13:
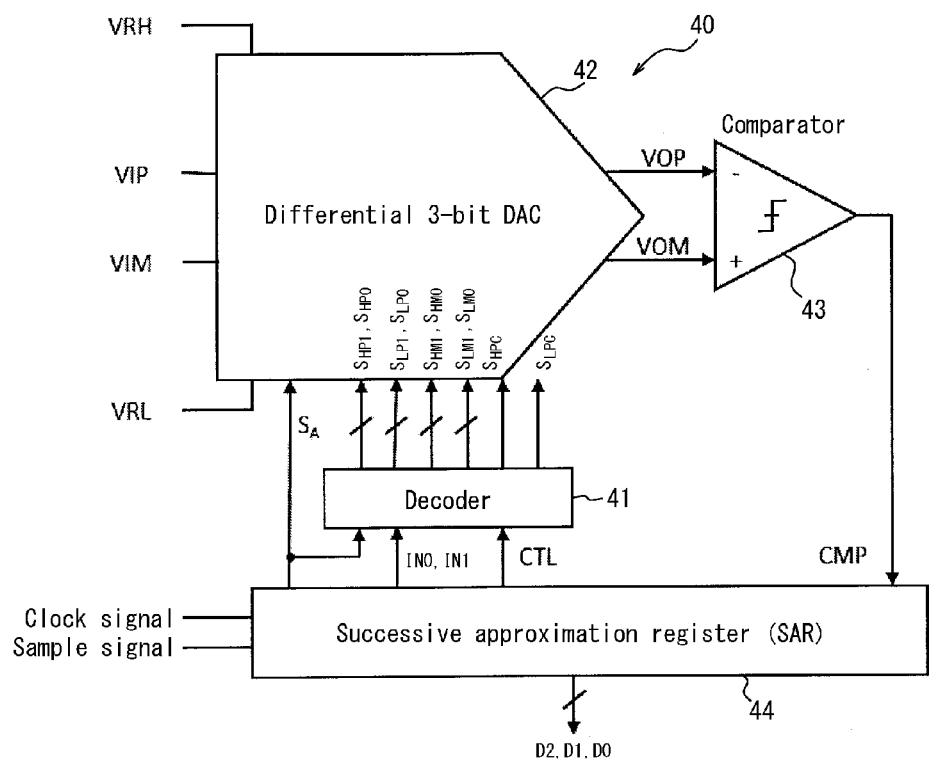
FIG. 13 is a functional block diagram illustrating an example of a 3-bit successive approximation ADC according to Embodiment 2.

FIG. 13 is a functional block diagram illustrating an example of a 3-bit successive approximation ADC according to Embodiment 2. A 3-bit successive approximation ADC 40 includes a decoder 41, a differential 3-bit DAC 42, a comparator 43, and a SAR 44 and operates with single end signals. The functions of the decoder 41, differential 3-bit DAC 42, comparator 43, and SAR 44 are similar to those of the decoder 11, differential 4-bit DAC 12, comparator 13, and SAR 14 of Embodiment 1, and therefore a description thereof is omitted. The differential 3-bit DAC 42, however, differs from the differential 4-bit DAC 12 by outputting analog output voltage with 3-bit resolution.

In addition to the control signals for successive approximation processing IN0 and IN1 and the signal $S_A$ described in the SAR 34, the SAR 44 outputs a signal CTL. The signal CTL is an input signal for controlling the positive 3-bit DAC and the negative 3-bit DAC asymmetrically during the last bit trial. Accordingly, when performing the last bit trial, the signal CTL is output from the SAR 44 to the decoder 41.

Based on the signals IN0, IN1, and CTL input from the SAR 44, the decoder 41 generates signals $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ and outputs the generated signals to the differential 3-bit DAC 42. The signals $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ are signals for performing on/off control of the respective switches $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ illustrated in FIG. 14.

The signals $S_A$, $S_A'$, $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ are each output as either "1" indicating "on" or "0" indicating "off". The signals $S_A$ and $S_A'$ perform mutually inverse on/off control. The digital signal output from the 3-bit successive approximation ADC 40 is referred to as $D_{out}$.

Figure 14:
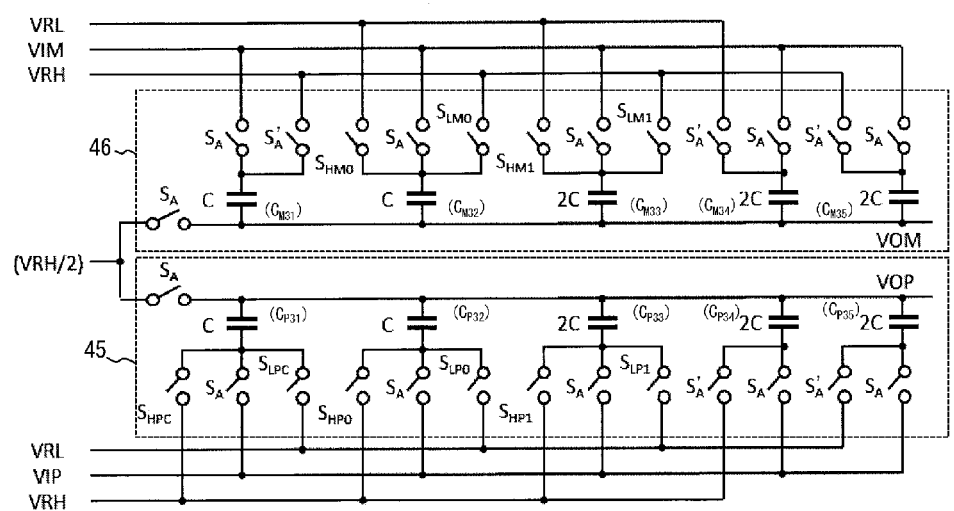
FIG. 14 is a functional block diagram illustrating an example of the differential 3-bit DAC in FIG. 13.

FIG. 14 illustrates an example of the circuit structure of the differential 3-bit DAC 42 of FIG. 13. As illustrated in FIG. 14, the differential 3-bit DAC 42 includes a positive 3-bit DAC 45 and a negative 3-bit DAC 46. The positive 3-bit DAC 45 and the negative 3-bit DAC 46 each include five capacitors as passive components. In other words, the positive 3-bit DAC 45 and the negative 3-bit DAC 46 in this embodiment are structured with the same number of passive components as the positive 2-bit DAC 35 and negative 2-bit DAC 36 illustrated in FIG. 10.

In FIG. 14, the capacitors $C_{P31}$, $C_{P32}$, $C_{P33}$, $C_{P34}$, and $C_{P35}$ in the positive 3-bit DAC 45 respectively have capacitances of C, C, 2C, 2C, and 2C. The capacitors $C_{M31}$, $C_{M32}$, $C_{M33}$, $C_{M34}$, and $C_{M35}$ in the negative 3-bit DAC 46 respectively have capacitances of C, C, 2C, 2C, and 2C.

In the positive 3-bit DAC 45, the capacitor $C_{P31}$ is connected to the positive analog input voltage VIP and the low-voltage reference voltage VRL respectively via the switches $S_A$ and $S_{LPC}$. The capacitor $C_{P31}$ is further connected to the high-voltage reference voltage VRH via the switch $S_{HPC}$. The capacitor $C_{P32}$ is connected in parallel to the positive analog input voltage VIP, the high-voltage reference voltage VRH, and the low-voltage reference voltage VRL respectively via the switches $S_A$, $S_{HP0}$, and $S_{LP0}$. The capacitor $C_{P33}$ is connected in parallel to the positive analog input voltage VIP, the high-voltage reference voltage VRH, and the low-voltage reference voltage VRL respectively via the switches $S_A$, $S_{HP1}$, and $S_{LP1}$.

The capacitors $C_{P34}$ and $C_{P35}$ are connected to the positive analog input voltage VIP via respective switches $S_A$. The capacitor $C_{P34}$ is connected to the high-voltage reference voltage VRH via the switch $S_A'$, and the capacitor $C_{P35}$ is connected to the low-voltage reference voltage VRL via the switch $S_A'$. The capacitors $C_{P31}$, $C_{P32}$, $C_{P33}$, $C_{P34}$, and $C_{P35}$ are connected to a common voltage of the comparator input via the switch $S_A$. The common voltage is fixed at VRH/2.

In the negative 3-bit DAC 46, the capacitor $C_{M31}$ is connected to the negative analog input voltage VIM and the high-voltage reference voltage VRH respectively via the switches $S_A$ and $S_A'$. The capacitor $C_{M32}$ is connected in parallel to the negative analog input voltage VIM, the low-voltage reference voltage VRL, and the high-voltage reference voltage VRH respectively via the switches $S_A$, $S_{HM0}$, and $S_{LM0}$. The capacitor $C_{M33}$ is connected in parallel to the negative analog input voltage VIM, the low-voltage reference voltage VRL, and the high-voltage reference voltage VRH respectively via the switches $S_A$, $S_{HM1}$, and $S_{LM1}$.

The capacitors $C_{M34}$ and $C_{M35}$ are connected to the negative analog input voltage VIM via respective switches $S_A$. The capacitor $C_{M34}$ is connected to the low-voltage reference voltage VRL via the switch $S_A'$, and the capacitor $C_{M35}$ is connected to the high-voltage reference voltage VRH via the switch $S_A'$. The capacitors $C_{M31}$, $C_{M32}$, $C_{M33}$, $C_{M34}$, and $C_{M35}$ are connected to the fixed voltage VRH/2 via the switch $S_A$.

In the differential 3-bit DAC 42, the capacitors $C_{P34}$, $C_{P35}$, $C_{M34}$, and $C_{M35}$ are provided in order to match the differential voltage between the positive analog input voltage VIP and the negative analog input voltage VIM, which are single end signals, to the differential voltage between the high-voltage reference voltage VRH and the low-voltage reference voltage VRL. In other words, with the capacitors $C_{P34}$, $C_{P35}$, $C_{M34}$, and $C_{M35}$, even when the input voltage is a single end signal, the differential voltage between the positive analog input voltage VIP and the negative analog input voltage VIM becomes the same differential voltage as when the input voltage is a differential signal. Therefore, the resolution in the differential 3-bit DAC 42 can be maintained without any reduction.

Next, with reference to FIGS. 15 and 16, an example of each signal and of digital output in the 3-bit successive approximation ADC 40 is described. In FIGS. 15 and 16, the logic level of the signals IN0, IN1, and CMP is indicated as "0" or "1".

FIG. 15 illustrates signals input into the differential 3-bit DAC 42 of FIG. 13. In FIG. 15, the on/off states of the signals $S_A$, IN1, IN0, CTL, $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ in the sampling phase and the trial phase are indicated in table form. As illustrated in FIG. 15, in the sampling phase, only the signal $S_A$ is on, i.e. the switches $S_A$ in FIG. 14 are on. As a result, a charge corresponding to the positive analog input voltage VIP accumulates in the capacitors $C_{P31}$, $C_{P32}$, $C_{P33}$, $C_{P34}$, and $C_{P35}$ of the positive 3-bit DAC 45, and a charge corresponding to the negative analog input voltage VIM accumulates in the capacitors $C_{M31}$, $C_{M32}$, $C_{M33}$, $C_{M34}$, and $C_{M35}$ of the negative 3-bit DAC 46. In the trial phase, the signals $S_{LP1}$, $S_{LP0}$, $S_{LPC}$, $S_{LM1}$, and $S_{LM0}$ are controlled to be on/off inversely from the signals $S_{HP1}$, $S_{HP0}$, $S_{HPC}$, $S_{HM1}$, and $S_{HM0}$ respectively. Therefore, the switches $S_{LP1}$, $S_{LP0}$, $S_{LPC}$, $S_{LM1}$, and $S_{LM0}$ are controlled to be on/off inversely from the switches $S_{HP1}$, $S_{HP0}$, $S_{HPC}$, $S_{HM1}$, and $S_{HM0}$ respectively.

As can be seen from FIGS. 14 and 15, in the differential 3-bit DAC 42, unlike the differential 2-bit DAC 32 described in FIGS. 10 and 11, different signals $S_{HP1}$, $S_{HP0}$, $S_{HPC}$, $S_{LP1}$, $S_{LP0}$, $S_{LPC}$, $S_{HM1}$, $S_{HM0}$, $S_{LM1}$, and $S_{LM0}$ are input into the positive 3-bit DAC 45 and negative 3-bit DAC 46. As a result, the positive 3-bit DAC 45 and negative 3-bit DAC 46 are controlled individually.

As can be seen from FIG. 15, in the case that the signals IN1 and IN0 are both "0", if the signal CTL is "0", then the signals $S_{HP1}$ and $S_{HP0}$ are both "0", whereas if the signal CTL is "1", then the signal $S_{HP1}$ is "0" and the signal $S_{HP0}$ is "1". In the case that the signal IN1 is "0" and the signal IN0 is "1", if the signal CTL is "0", then the signal $S_{HP1}$ is "0" and the signal $S_{HP0}$ is "1", whereas if the signal CTL is "1", then the signal $S_{HP1}$ is "1" and the signal $S_{HP0}$ is "0". In the case that the signal IN1 is "1" and the signal IN0 is "0", if the signal CTL is "0", then the signal $S_{HP1}$ is "1" and the signal $S_{HP0}$ is "0", whereas if the signal CTL is "1", then the signal $S_{HP1}$ and the signal $S_{HP0}$ are both "1". In the case that the signals IN1 and IN0 are both "1", the signals $S_{HP1}$ and $S_{HP0}$ are both "1". However, if the signal CTL is "0", then the signal $S_{HPC}$ is "0", whereas if the signal CTL is "1", then the signal $S_{HPC}$ is "1".

FIG. 16 illustrates an example of digital output by the successive approximation ADC 40 of FIG. 13. Here, it is assumed that the high-voltage reference voltage VRH is 8 V and the low-voltage reference voltage VRL is 0 V. FIG. 16 illustrates the digital output $D_{out}$ that is output in accordance with the value of the positive analog input voltage VIP in the case that the negative analog input voltage VIM is a fixed value. In this case, FIG. 16 illustrates the results for when the negative analog input voltage VIM is VRH/2. FIG. 16 also illustrates the results for when voltages in 1 V increments from 0.5 V to 7.5 V are input as the value of the positive analog input voltage VIP.

In FIG. 16, the positive analog output voltage VOP and the negative analog output voltage VOM are calculated by Equations (3) and (4) below, which are derived from the law of conservation of charge.

$$VOP=VRH/2-VIP+(1/8)*VRH*(2*S_{HP1}+S_{HP0}+S_{HPC}+2) \quad (3)$$

$$VOM=VRH/2-VIM+(1/8)*VRH*(2*S_{LM1}+S_{LM0}+2) \quad (4)$$

In FIG. 16, the signals D2, D1, and D0 are the comparison signal CMP in the first bit trial, second bit trial, and last bit trial respectively. In the last bit trial, the signal CTL is "1".

As illustrated in FIG. 16, $D_{out}$ is output at eight levels from 0 to 7 based on the signals D2, D1, and D0 output by the first bit trial, second bit trial, and last bit trial in accordance with the value of the positive analog input voltage VIP. In this way, as compared to the 2-bit successive approximation ADC 30, the 3-bit successive approximation ADC 40 can increase resolution by one bit with a simple structure that only adds one switch $S_{HPC}$, without increasing the number of passive components.

Embodiment 3

While the differential DACs in Embodiment 1 and Embodiment 2 (differential 4-bit DAC 12 and differential 3-bit DAC 32) have been described as including capacitors as passive components, the passive components in the differential DAC are not limited to capacitors. The passive components in the differential DAC may be configured using resistors. The passive components in the differential DAC may also be configured using a combination of resistors and capacitors. An example of configuring a differential DAC using a combination of resistors and capacitors is described as Embodiment 3.

Figure 17:
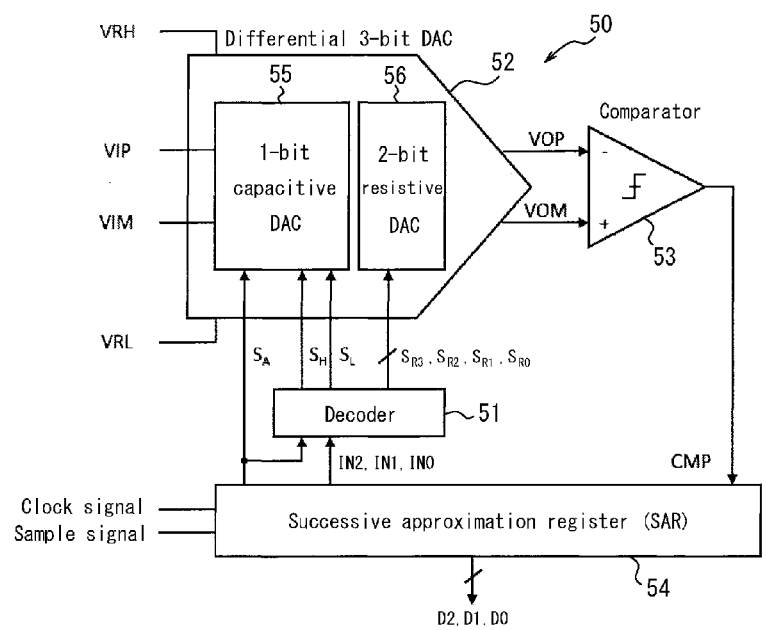
FIG. 17 is a functional block diagram illustrating an example of a successive approximation ADC.

FIG. 17 illustrates an example of a successive approximation ADC related to this embodiment, namely a 3-bit successive approximation ADC that includes differential 3-bit DACs configured using a combination of resistors and capacitors as passive components. The 3-bit successive approximation ADC 50 illustrated in FIG. 17 includes a decoder 51, a differential 3-bit DAC 52, a comparator 53, and a SAR 54. The functions of the decoder 51, comparator 53, and SAR 54 are similar to those of the decoder 11, comparator 13, and SAR 14 of Embodiment 1, and therefore a description thereof is omitted.

As illustrated in FIG. 17, the differential 3-bit DAC 52 includes a 1-bit capacitive DAC 55 and a 2-bit resistive DAC 56. The differential 3-bit DAC 52 outputs analog output voltage with a total of 3-bit resolution using the 1-bit capacitive DAC 55 and the 2-bit resistive DAC 56.

The SAR 54 generates IN0, IN1, and IN2 as control signals for successive approximation processing and outputs the generated control signals for successive approximation processing to the decoder 51. The SAR 54 generates a signal $S_A$ and outputs the generated signal $S_A$ to the differential 3-bit DAC 52.

Based on the signals IN0, IN1, and IN2 input from the SAR 54, the decoder 51 generates signals $S_H$ and $S_L$, outputting the generated signals $S_H$ and $S_L$ to the 1-bit capacitive DAC 55, and also generates signals $S_{R0}$, $S_{R1}$, $S_{R2}$, and $S_{R3}$, outputting the generated signals $S_{R0}$, $S_{R1}$, $S_{R2}$, and $S_{R3}$ to the 2-bit resistive DAC 56. The signals $S_H$, $S_L$, $S_{R0}$, $S_{R1}$, $S_{R2}$, and $S_{R3}$ are signals for performing on/off control of the respective switches $S_H$, $S_L$, $S_{R0}$, $S_{R1}$, $S_{R2}$, and $S_{R3}$ illustrated in FIG. 18. The signals $S_H$, $S_L$, $S_{R0}$, $S_{R1}$, $S_{R2}$, and $S_{R3}$ are each output as either "1" indicating "on" or "0" indicating "off".

Figure 18:
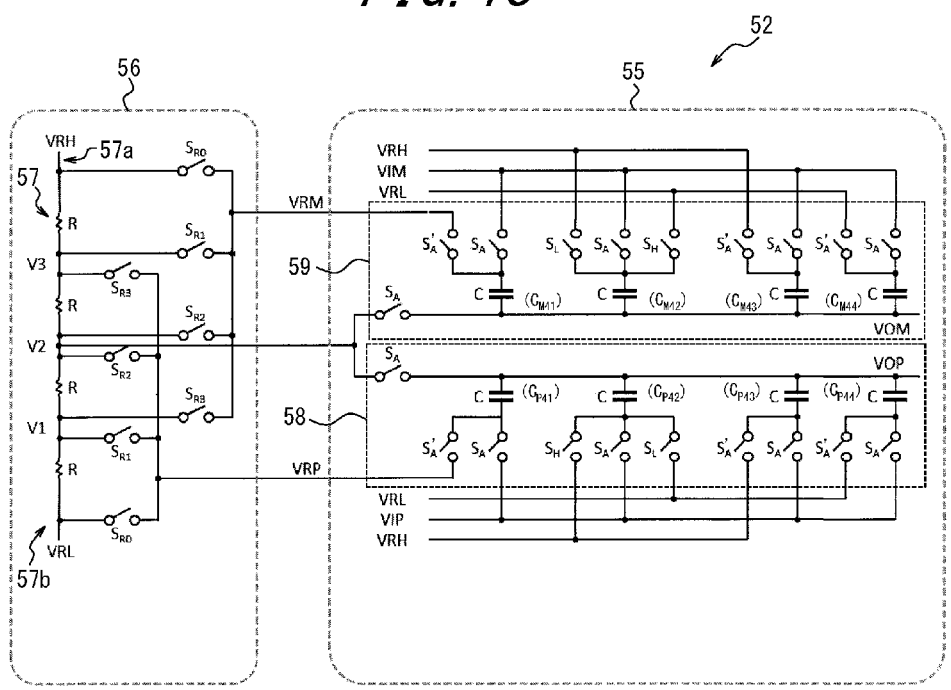
FIG. 18 illustrates an example of the circuit structure of the differential 3-bit DAC of FIG. 17.

FIG. 18 illustrates an example of the circuit structure of the differential 3-bit DAC 52 of FIG. 17. As illustrated in FIG. 18, the 2-bit resistive DAC 56 includes a resistor string 57 with four resistors R connected in series as passive components. The high-voltage reference voltage VRH is supplied from one end 57a of the resistor string 57, and the low-voltage reference voltage VRL is supplied from the other end 57b. The voltage between resistors R is set to V3, V2, and V1 in order from the end 57a at which the high-voltage reference voltage VRH is supplied.

In the resistor string 57, a switch $S_{R0}$ is connected to the end 57a, and in order from the end 57a, switches $S_{R1}$, $S_{R2}$, and $S_{R3}$ are connected between the resistors R. In other words, in the resistor string 57, the switch $S_{R1}$ is connected to the node of the voltage V3, the switch $S_{R2}$ is connected to the node of the voltage V2, and the switch $S_{R3}$ is connected to the node of the voltage V1. These switches $S_{R0}$, $S_{R1}$, $S_{R2}$, and $S_{R3}$ are connected in parallel, and a negative reference voltage VRM is output from the other side of these switches that is not connected to the resistor string 57.

In the resistor string 57, a switch $S_{R0}$ is connected to the other end 57b, and in order from the other end 57b, switches $S_{R1}$, $S_{R2}$, and $S_{R3}$ are connected between the resistors R. In other words, in the resistor string 57, the switch $S_{R1}$ is connected to the node of the voltage V1, the switch $S_{R2}$ is connected to the node of the voltage V2, and the switch $S_{R3}$ is connected to the node of the voltage V3. These switches $S_{R0}$, $S_{R1}$, $S_{R2}$, and $S_{R3}$ are connected in parallel, and a positive reference voltage VRP is output from the other side of these switches that is not connected to the resistor string 57.

The 1-bit capacitive DAC 55 includes a positive 1-bit DAC 58 and a negative 1-bit DAC 59. The positive 1-bit DAC 58 and the negative 1-bit DAC 59 each include four capacitors as passive components. For example, the capacitors $C_{P41}$, $C_{P42}$, $C_{P43}$, and $C_{P44}$ are disposed in the positive 1-bit DAC 58, and the capacitors $C_{M41}$, $C_{M42}$, $C_{M43}$, and $C_{M44}$ are disposed in the negative 1-bit DAC 59.

In the positive 1-bit DAC 58, the capacitor $C_{P41}$ is connected to the positive analog input voltage VIP via the switch $S_A$. The capacitor $C_{P41}$ is also connected to the positive reference voltage VRP output by the 2-bit resistive DAC 56 via the switch $S_A'$. The capacitor $C_{P42}$ is connected to the positive analog input voltage VIP, the high-voltage reference voltage VRH, and the low-voltage reference voltage VRL respectively via the switches $S_A$, $S_H$, and $S_L$.

The capacitors $C_{P43}$ and $C_{P44}$ are connected to the positive analog input voltage VIP via respective switches $S_A$. The capacitor $C_{P43}$ is connected to the high-voltage reference voltage VRH via the switch $S_A'$, and the capacitor $C_{P44}$ is connected to the low-voltage reference voltage VRL via the switch $S_A'$. The capacitors $C_{P41}$, $C_{P42}$, $C_{P43}$, and $C_{P44}$ are connected to the output voltage V2 of the 2-bit resistive DAC 56 via the switch $S_A$.

In the negative 1-bit DAC 59, the capacitor $C_{M41}$ is connected to the negative analog input voltage VIM via the switch $S_A$. The capacitor $C_{M41}$ is also connected to the negative reference voltage VRM output by the 2-bit resistive DAC 56 via the switch $S_A'$. The capacitor $C_{M42}$ is connected to the negative analog input voltage VIM, the low-voltage reference voltage VRL, and the high-voltage reference voltage VRH respectively via the switches $S_A$, $S_H$, and $S_L$.

The capacitors $C_{M43}$ and $C_{M44}$ are connected to the negative analog input voltage VIM via respective switches $S_A$. The capacitor $C_{M43}$ is connected to the high-voltage reference voltage VRH via the switch $S_A'$, and the capacitor $C_{M44}$ is connected to the low-voltage reference voltage VRL via the switch $S_A'$. The capacitors $C_{M41}$, $C_{M42}$, $C_{M43}$, and $C_{M44}$ are connected to the node of the output voltage V2 of the 2-bit resistive DAC 56 via the switch $S_A$.

In the differential 3-bit DAC 52, the capacitors $C_{P43}$, $C_{P44}$, $C_{M43}$, and $C_{M44}$ are provided in order to match the differential voltage between the positive analog input voltage VIP and the negative analog input voltage VIM, which are single end signals, to the differential voltage between the high-voltage reference voltage VRH and the low-voltage reference voltage VRL. In other words, with the capacitors $C_{P43}$, $C_{P44}$, $C_{M43}$, and $C_{M44}$, even when the input voltage is a single end signal, the differential voltage between the positive analog input voltage VIP and the negative analog input voltage VIM becomes the same differential voltage as when the input voltage is a differential signal. Therefore, the resolution in the differential 3-bit DAC 52 can be maintained without any reduction.

In the differential 3-bit DAC 52, the switches are controlled based on the signals input from the decoder 51, and the positive analog output voltage VOP and negative analog output voltage VOM with a total of 3-bit resolution are output.

The differential 3-bit DAC 52 uses the same signals $S_{R0}$, $S_{R1}$, $S_{R2}$, and $S_{R3}$ to control the circuit that outputs the positive reference voltage VRP and the negative reference voltage VRM. Therefore, synchronous control is executed in these circuits.

Figure 19:
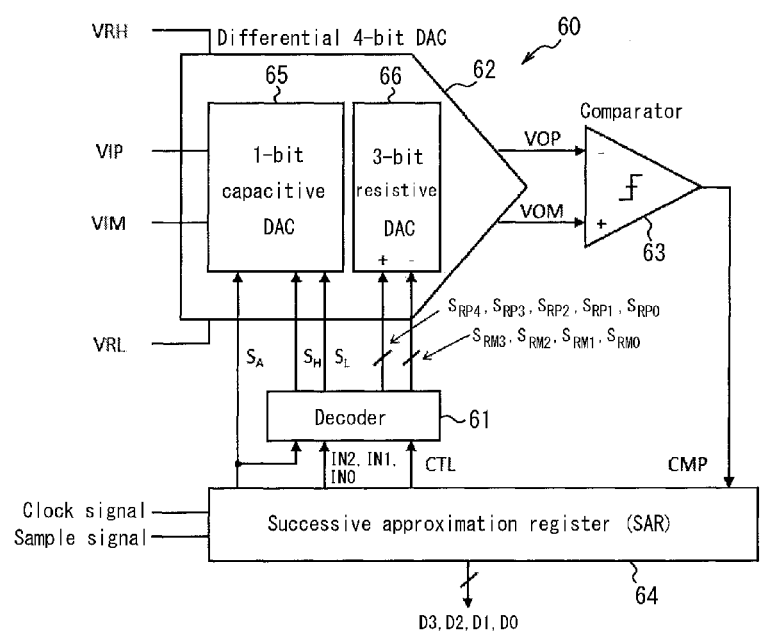
FIG. 19 is a functional block diagram illustrating an example of a 4-bit successive approximation ADC according to Embodiment 3.

FIG. 19 is a functional block diagram illustrating an example of a 4-bit successive approximation ADC according to Embodiment 3. The 4-bit successive approximation ADC 60 illustrated in FIG. 19 includes a decoder 61, a differential 4-bit DAC 62, a comparator 63, and a SAR 64. The functions of the decoder 61, comparator 63, and SAR 64 are similar to those of the decoder 11, comparator 13, and SAR 14 of Embodiment 1, and therefore a description thereof is omitted.

As illustrated in FIG. 19, the differential 4-bit DAC 62 includes a 1-bit capacitive DAC 65 and a 3-bit resistive DAC 66. The differential 4-bit DAC 62 outputs analog output voltage with a total of 4-bit resolution using the 1-bit capacitive DAC 65 and the 3-bit resistive DAC 66.

The SAR 64 generates IN0, IN1, and IN2 as control signals for successive approximation processing and outputs the generated control signals for successive approximation processing to the decoder 61. The SAR 64 generates a signal $S_A$ and outputs the generated signal $S_A$ to the differential 4-bit DAC 62. The SAR 64 also generates an input signal CTL for executing asynchronous control in the last bit trial and outputs the signal CTL to the decoder 61.

Based on the signals IN0, IN1, and IN2 input from the SAR 64, the decoder 61 generates signals $S_H$ and $S_L$, outputting the generated signals $S_H$ and $S_L$ to the 1-bit capacitive DAC 55, and also generates signals $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$, outputting the generated signals $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$ to the 3-bit resistive DAC 66. The signals $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$ are signals for performing on/off control of the respective switches $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$ illustrated in FIG. 20. The signals $S_H$, $S_L$, $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$ are each output as either "1" indicating "on" or "0" indicating "off".

Figure 20:
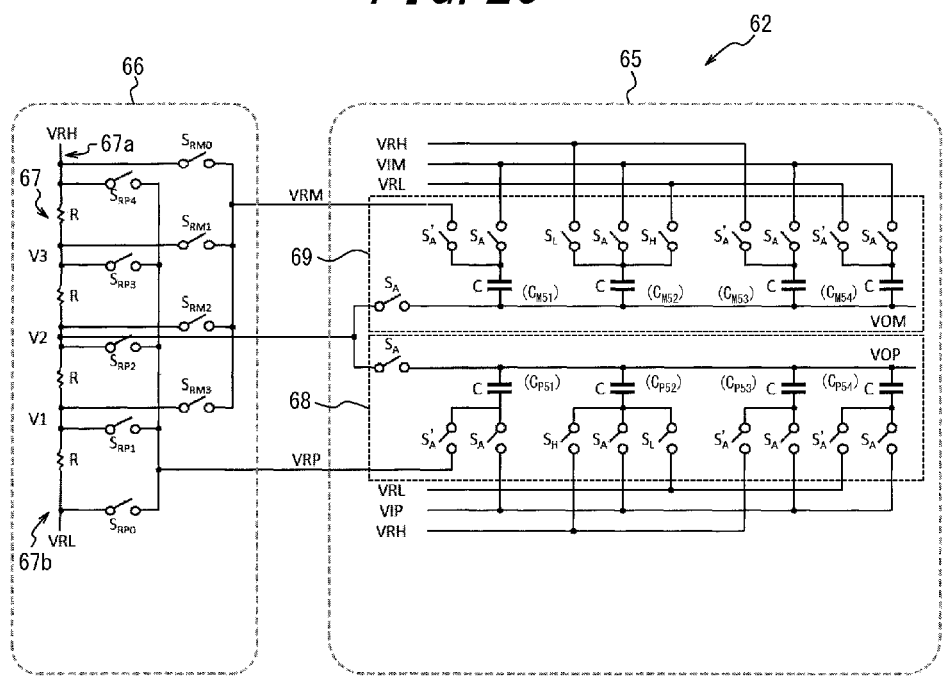
FIG. 20 illustrates an example of the circuit structure of the differential 4-bit DAC of FIG. 19.

FIG. 20 illustrates an example of the circuit structure of the differential 4-bit DAC 62 of FIG. 19. As illustrated in FIG. 20, the 3-bit resistive DAC 66 includes a resistor string 67 with four resistors R connected in series as passive components. The high-voltage reference voltage VRH is supplied from one end 67a of the resistor string 67, and the low-voltage reference voltage VRL is supplied from the other end 67b. The voltage between resistors R is set to V3, V2, and V1 in order from the end 67a at which the high-voltage reference voltage VRH is supplied.

In the resistor string 67, a switch $S_{RM0}$ is connected to the end 67a, and in order from the end 67a, switches $S_{RM1}$, $S_{RM2}$, and $S_{RM3}$ are connected between the resistors R. In other words, in the resistor string 67, the switch $S_{RM1}$ is connected to the node of the voltage V3, the switch $S_{RM2}$ is connected to the node of the voltage V2, and the switch $S_{RM3}$ is connected to the node of the voltage V1. These switches $S_{RM0}$, $S_{RM1}$, $S_{RM2}$, and $S_{RM3}$ are connected in parallel, and a negative reference voltage VRM is output from the other side of these switches that is not connected to the resistor string 67.

In the resistor string 67, a switch $S_{RP0}$ is connected to the other end 67b, and in order from the other end 67b, switches $S_{RP1}$, $S_{RP2}$, $S_{RP3}$, and $S_{RP4}$ are connected between the resistors R. In other words, in the resistor string 67, the switch $S_{RP1}$ is connected to the node of the voltage V1, the switch $S_{RP2}$ is connected to the node of the voltage V2, the switch $S_{RP3}$ is connected to the node of the voltage V3, and the switch $S_{RP4}$ is connected to the node of the high-voltage reference voltage VRH. These switches $S_{RP0}$, $S_{RP1}$, $S_{RP2}$, $S_{RP3}$, and $S_{RP4}$ are connected in parallel, and a positive reference voltage VRP is output from the other side of these switches that is not connected to the resistor string 67.

The 1-bit capacitive DAC 65 includes a positive 1-bit DAC 68 and a negative 1-bit DAC 69. The structure of the 1-bit capacitive DAC 65 is similar to that of the above-described 1-bit capacitive DAC 55, and therefore a description thereof is omitted.

Next, with reference to FIGS. 21 to 24, an example of each signal and of digital output in the 4-bit successive approximation ADC 60 is described.

FIG. 21 illustrates signals input into the 1-bit capacitive DAC 65 of FIG. 19. In FIG. 21, the on/off states of the signals $S_A$, $S_H$, and $S_L$ and the logic level of the signal IN2 in the sampling phase and the trial phase are indicated in table form. As illustrated in FIG. 21, in the sampling phase, the signal $S_A$ is on, i.e. the switches $S_A$ in FIG. 20 are on. As a result, a charge corresponding to the positive analog input voltage VIP accumulates in the capacitors $C_{P51}$, $C_{P52}$, $C_{P53}$, and $C_{P54}$ of the positive 1-bit DAC 68, and a charge corresponding to the negative analog input voltage VIM accumulates in the capacitors $C_{M51}$, $C_{M52}$, $C_{M53}$, and $C_{M54}$ of the negative 1-bit DAC 69.

FIG. 22 illustrates signals input to and output from the 3-bit resistive DAC of FIG. 19. Here, it is assumed that the high-voltage reference voltage VRH is 16 V, the low-voltage reference voltage VRL is 0 V, the voltage V3 is 12 V, the voltage V2 is 8 V, and the voltage V1 is 4 V. In FIG. 22, the signals IN1, IN0, and CTL input into the decoder 61, the signals $S_{RP0}$, $S_{RP1}$, $S_{RP2}$, $S_{RP3}$, $S_{RP4}$, $S_{RM0}$, $S_{RM1}$, $S_{RM2}$, and $S_{RM3}$ output by the decoder 61 to the 3-bit resistive DAC 66 based on the signals IN1, IN0, and CTL, and the positive reference voltage VRP and negative reference voltage VRM output by the 3-bit resistive DAC 66 are indicated in table form.

As illustrated in FIG. 22, the signals $S_{RM0}$, $S_{RM1}$, $S_{RM2}$, and $S_{RM3}$ do not change regardless of whether the signal CTL is "0" or "1". Therefore, the switches $S_{RM0}$, $S_{RM1}$, $S_{RM2}$, and $S_{RM3}$ perform the same on/off operations, regardless of whether the last bit trial is being performed. Conversely, when the signal CTL is "1", the on/off state of the signals $S_{RP0}$, $S_{RP1}$, $S_{RP2}$, $S_{RP3}$, and $S_{RP4}$ changes as compared to when the signal CTL is "0". Therefore, the on/off operations of the switches $S_{RP0}$, $S_{RP1}$, $S_{RP2}$, $S_{RP3}$, and $S_{RP4}$ change between when the signal CTL is "1" and when the signal CTL is "0". In this way, the 3-bit resistive DAC 66 achieves asymmetrical control during the last bit test.

By performing asymmetrical control, the 3-bit resistive DAC 66 can output the positive reference voltage VRP and the negative reference voltage VRM with 3-bit resolution. In this way, the differential 4-bit DAC 62 outputs analog voltage with 4-bit resolution.

FIG. 23 illustrates an example of digital output by the successive approximation ADC 60 of FIG. 19. FIG. 23 illustrates the digital output $D_{out}$ in the case of a single end signal being input into the differential 4-bit DAC 62. In other words, the negative analog input voltage VIM is V2 (8 V). FIG. 23 illustrates the results for when voltages in 1 V increments from 0.5 V to 15.5 V are input as the value of the positive analog input voltage VIP.

In FIG. 23, the positive analog output voltage VOP and the negative analog output voltage VOM are calculated by Equations (5) and (6) below, which are derived from the law of conservation of charge.

$$VOP = VRH/2 - VIP + (1/4)*(VRP + VRH*(S_H + 1)) \quad (5)$$

$$VOM = VRH/2 - VIM + (1/4)*(VRM + VRH*(S_L + 1)) \quad (6)$$

In FIG. 23, the signals D3, D2, D1, and D0 are the comparison signal CMP in the first bit trial, second bit trial, third bit trial, and last bit trial respectively. In the last bit trial, the signal CTL is "1".

FIG. 24 illustrates another example of digital output by the successive approximation ADC 60 of FIG. 19. FIG. 24 illustrates the digital output $D_{out}$ in the case of a differential signal being input into the differential 4-bit DAC 62. Letting the difference between the positive analog input voltage VIP and the negative analog input voltage VIM be ΔVI, FIG. 23 illustrates the results for when voltages in 1 V increments from −7.5 V to 7.5 V are input as ΔVI.

As illustrated in FIGS. 23 and 24, $D_{out}$ is output at 16 levels from 0 to 15 based on the signals D3, D2, D1, and D0 output by the first bit trial, second bit trial, third bit trial, and last bit trial. In this way, as compared to the 3-bit successive approximation ADC 50, the 4-bit successive approximation ADC 60 can increase resolution by one bit with a simple structure that only adds one switch $S_{RP4}$, without increasing the number of passive components.

Although embodiments have been described based on examples and on the accompanying drawings, it is to be noted that various changes and modifications will be apparent to those skilled in the art based on this disclosure.

Therefore, such changes and modifications are to be understood as included within the scope of this disclosure. For example, the functions and the like included in the components may be reordered in any logically coherent way. Furthermore, units, steps, and the like may be combined into one or divided, and/or additional units, steps and the like may be used within the scope of this disclosure.

For example, whereas only the positive side is controlled in the last bit trial in the above embodiments, control of the last bit trial is not limited in this way. For example, the effects of this disclosure can be obtained by controlling only the negative side in the last bit trial. In another example, the effects of this disclosure may be obtained by alternating control between the positive side and the negative side of the last bit trial in different/subsequent conversion operations, where such alternating control may be based on a bit (e.g., stored in a register) that is set by an outside control signal provided to the SAR.

For example, in Embodiments 1 to 3, a successive approximation ADC that includes a differential DAC (differential 4-bit DAC 12, differential 3-bit DAC 42, and differential 4-bit DAC 62) and a comparator (comparator 13, 43, and 63) has been described, but this disclosure is not limited to these examples. For example, instead of the differential DAC and comparator, this disclosure may be applied to a configuration with a parallel (flash) ADC that includes a differential comparator circuit.

Figure 25:
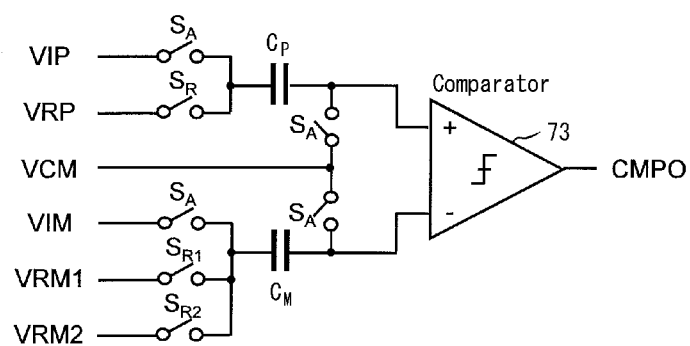
FIG. 25 illustrates an example of the circuit structure of a differential comparator circuit provided in a flash ADC according to this disclosure.

FIG. 25 illustrates an example of the circuit structure of a differential comparator circuit provided in a flash ADC according to this disclosure. The differential comparator circuit includes a capacitor $C_P$ connected to the positive input terminal and a capacitor $C_M$ connected to the negative input terminal of a comparator 73. An input common voltage VCM is connected to the positive and negative input terminals of the comparator 73 via respective switches $S_A$.

The capacitor $C_P$ is connected to a positive analog input voltage VIP and a positive reference voltage VRP respectively via the switches $S_A$ and $S_R$. The capacitor $C_M$ is connected to a negative analog input voltage VIM, a first negative reference voltage VRM1, and a second negative reference voltage VRM2 respectively via the switches $S_A$, $S_{R1}$, and $S_{R2}$. These switches $S_A$, $S_R$, $S_{R1}$, and $S_{R2}$ are controlled to be on/off based on signals provided from the decoder. By including a plurality (for example, $2^N$ (N being an integer greater than or equal to one)) of the differential comparator circuits illustrated in FIG. 25 the flash ADC according to this disclosure converts an analog signal into a digital signal with (N+1)-bit resolution.

FIG. 26 illustrates an example of the control state of each switch in the differential comparator circuit illustrated in FIG. 25. In FIG. 26, the "on" and "off" states of each switch are illustrated respectively as "1" and "0". The differential comparator circuit performs analog-digital conversion in three steps: sampling, coarse control, and fine control.

As illustrated in FIG. 26, during sampling, the switches $S_A$ are on, and a charge accumulates in the capacitors $C_P$ and $C_M$. Next, during coarse ADC processing, the switch SR on the positive side and the switch $S_{R1}$ on the negative side turn on. During fine ADC processing, the switch SR on the positive side remains on, while on the negative side, the switch $S_{R1}$ turns off, and the switch $S_{R2}$ turns on. In other words, in the coarse ADC processing and fine ADC processing, only the reference voltage supplied to the capacitor $C_M$ on the negative side changes. In a typical differential comparator circuit, as compared to the differential comparator circuit illustrated in FIG. 25, since there is only one input of reference voltage on the negative side, symmetrical control is performed on the positive side and the negative side during ADC processing. By contrast, asymmetrical control is performed as described above in the differential comparator circuit provided with the flash ADC according to this disclosure.

FIG. 27 illustrates an example of digital output by a 3-bit parallel ADC that includes four of the differential comparator circuits illustrated in FIG. 25. FIG. 27 illustrates an example of the case in which the difference in potential between the positive reference voltage VRP and the first negative reference voltage VRM1 is 8 V. In the 3-bit parallel ADC, coarse 2-bit ADC processing executed when the switch SRI is on and fine 1-bit ADC processing executed when the switch $S_{R2}$ is on are executed.

In FIG. 27, the CMP# indicates the ID number of the four comparators included in the 3-bit parallel ADC. The four comparators are indicated below as CMP#1, CMP#2, CMP#3, and CMP#4. The positive analog input voltage VIP and negative analog input voltage VIM are input into the four comparators CMP#1, CMP#2, CMP#3, and CMP#4.

In FIG. 27, ΔVIN is the differential voltage (analog input differential voltage) between the positive analog input voltage VIP and the negative analog input voltage VIM and is calculated as VIP−VIM. Furthermore, ΔVREF is the differential voltage (reference differential voltage) between the positive reference voltage VRP and either of the negative reference voltages VRM1 or VRM2 and is calculated as VRP−VRM1 or VRP−VRM2.

In the comparators CMP#1, CMP#2, CMP#3, and CMP#4, ΔVREF in the fine 1-bit ADC processing is increased by 2 V over the ΔVREF in the coarse 2-bit ADC processing. This difference is the difference between the first negative reference voltage VRM1 and the second negative reference voltage VRM2.

In FIG. 27, CMPO is the output logic of the comparator as a result of judging the magnitude relationship between ΔVIN and ΔVREF. In this example, when ΔVIN is greater than ΔVREF (ΔVIN>ΔVREF), a "1" is output, whereas when ΔVIN is less than ΔVREF (ΔVIN<ΔVREF), a "0" is output.

During the coarse 2-bit ADC processing, a 2-bit analog-digital output result $D_{out1}$ is calculated by converting a thermometer code, which is derived based on the output from the comparators CMP#1, CMP#2, CMP#3, and CMP#4, to a digital value.

During the fine 1-bit ADC processing, a 1-bit analog-digital output result $D_{out2}$ is calculated by converting a thermometer code, which is derived based on the output from the comparators CMP#1, CMP#2, CMP#3, and CMP#4, to a digital value.

Based on the analog-digital output result $D_{out1}$ and the analog-digital output result $D_{out2}$, the 3-bit parallel ADC calculates a 3-bit digital output $D_{out}$.

In this way, whereas an analog signal is converted to a digital signal with N-bit resolution by $2^N$ (N=2 in the above example) comparators in a typical flash ADC, an analog signal is converted to an (N+1)-bit digital signal by $2^N$ comparators in the flash ADC according to this disclosure.

What is claimed is:
1. An analog-digital converter comprising:
a digital-analog converter configured to output a differential voltage between a reference voltage and a voltage of an analog signal;
a comparator configured to output a comparison signal corresponding to the differential voltage output by the digital-analog converter; and a register configured to cause the digital-analog converter to generate N pairs of differential voltages, where N is an integer greater than or equal to one, to cause the digital-analog converter to generate an $(N+1)^{th}$ pair of differential voltages by causing one of a positive side and a negative side of the digital-analog converter to output an $(N+1)^{th}$ differential voltage and causing the other of the positive side and the negative side to output a differential voltage equal to an $N^{th}$ differential voltage as an $(N+1)^{th}$ differential voltage, and to output a digital signal corresponding to a smallest comparison signal having a smallest voltage among (N+1) of the comparison signals.

2. The analog-digital converter of claim 1, wherein the digital-analog converter is a differential digital-analog converter comprising a pair of converters that each include (N+1) passive components, the reference voltage and the voltage of the analog signal are input into the passive components, and N differential voltages are generated between the reference voltage and the voltage of the analog signal.

3. The analog-digital converter of claim 2, wherein the register causes one passive component in one converter of the pair of converters to connect to the reference voltage and output the $(N+1)^{th}$ differential voltage.

4. The analog-digital converter of claim 1, further comprising a decoder configured to input a digital signal into the digital-analog converter based on a signal acquired from the register.

5. The analog-digital converter of claim 2, wherein the passive components in the pair of converters are capacitors, resistors, or a combination of capacitors and resistors.

6. The analog-digital converter of claim 2, wherein the passive components in the pair of converters are configured with a binary system or a segmented system.

7. The analog-digital converter of claim 1, wherein the analog signal is a differential signal or a single end signal.

8. The analog-digital converter of claim 1, comprising a plurality of comparators that includes the comparator.

9. The analog-digital converter of claim 8, wherein two reference voltages with different voltage levels are connected via a switch to an input terminal on one of a positive side and a negative side in the plurality of comparators.

10. The analog-digital converter of claim 9, wherein the register switches the reference voltage connected to the input terminal by controlling the switch when causing the digital-analog converter to output the $(N+1)^{th}$ differential voltage.

11. A method used in an analog-digital converter including a digital-analog converter, a comparator, and a register, the method comprising:
the digital-analog converter outputting a differential voltage between a reference voltage and a voltage of an analog signal;
the comparator outputting a comparison signal corresponding to the differential voltage output by the digital-analog converter;
the register causing the digital-analog converter to generate N pairs of differential voltages, where N is an integer greater than or equal to one;
the register causing the digital-analog converter to generate an $(N+1)^{th}$ pair of differential voltages by causing one of a positive side and a negative side of the digital-analog converter to output an $(N+1)^{th}$ differential voltage and causing the other of the positive side and the negative side to output a differential voltage equal to an $N^{th}$ differential voltage as an $(N+1)^{th}$ differential voltage; and
the register outputting a digital signal corresponding to a smallest comparison signal having a smallest voltage among (N+1) of the comparison signals.

12. The method of claim 11, wherein:
the digital-analog converter comprises a pair of converters that each include (N+1) passive components; and the method further comprises the converters each inputting the reference voltage and the voltage of the analog signal into the passive components and generating N differential voltages between the reference voltage and the voltage of the analog signal.

13. The method of claim 12, further comprising the register causing one passive component in one converter of the pair of converters to connect to the reference voltage and output the $(N+1)^{th}$ differential voltage.

14. The method of claim 11, wherein:
the analog-digital converter comprises a decoder; and
the method further comprises the decoder inputting a digital signal into the digital-analog converter based on a signal acquired from the register.

15. The method of claim 12, wherein the passive components in the pair of converters are capacitors, resistors, or a combination of capacitors and resistors.

16. The method of claim 12, wherein the passive components in the pair of converters are configured with a binary system or a segmented system.

17. The method of claim 11, wherein the analog signal is a differential signal or a single end signal.

18. The method of claim 11, wherein the analog-digital converter comprises a plurality of comparators that includes the comparator.

19. The method of claim 18, wherein two reference voltages with different voltage levels are connected via a switch to an input terminal on one of a positive side and a negative side in the plurality of comparators.

20. The method of claim 19, further comprising the register switching the reference voltage connected to the input terminal by controlling the switch when causing the digital-analog converter to output the $(N+1)^{th}$ differential voltage.

\* \* \* \* \*